US011450705B2

(12) United States Patent
Mase et al.

(10) Patent No.: US 11,450,705 B2
(45) Date of Patent: Sep. 20, 2022

(54) LIGHT DETECTION ELEMENT AND LIGHT DETECTION DEVICE

(71) Applicant: HAMAMATSU PHOTONICS K.K., Hamamatsu (JP)

(72) Inventors: Mitsuhito Mase, Hamamatsu (JP); Keiki Taguchi, Hamamatsu (JP); Hajime Ishihara, Hamamatsu (JP); Hiroo Yamamoto, Hamamatsu (JP); Akihiro Shimada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 178 days.

(21) Appl. No.: 16/777,291

(22) Filed: Jan. 30, 2020

(65) Prior Publication Data
US 2020/0168656 A1    May 28, 2020

Related U.S. Application Data

(63) Continuation-in-part of application No. PCT/JP2019/027418, filed on Jul. 10, 2019.

(30) Foreign Application Priority Data

Oct. 16, 2018   (JP) .............................. JP2018-195146

(51) Int. Cl.
*H01L 27/146* (2006.01)
*G01J 1/44* (2006.01)
(Continued)

(52) U.S. Cl.
CPC .......... *H01L 27/14649* (2013.01); *G01J 1/44* (2013.01); *H01L 31/02019* (2013.01);
(Continued)

(58) Field of Classification Search
CPC ......... H01L 27/14649; H01L 31/02019; H01L 31/02161; H01L 31/022408;
(Continued)

(56) References Cited

U.S. PATENT DOCUMENTS 4,368,385 A * 1/1983 Kanbe ..................... H01L 31/11
250/551
2002/0084430 A1* 7/2002 Bamji ..................... G01S 17/894
250/559.05

(Continued)

FOREIGN PATENT DOCUMENTS

CN     107799543 A *  3/2018
JP     S63-001079 A    1/1988
(Continued)

OTHER PUBLICATIONS

English-language translation of International Preliminary Report on Patentability (IPRP) dated Apr. 29, 2021 that issued in WO Patent Application No. PCT/JP2019/027418.

*Primary Examiner* — Thanh Luu
*Assistant Examiner* — Monica T Taba
(74) *Attorney, Agent, or Firm* — Faegre Drinker Biddle & Reath LLP

(57) ABSTRACT

A light detection element includes a semiconductor substrate, a light absorbing layer of a first conductivity type formed on the semiconductor substrate, a cap layer of a first conductivity type formed on the light absorbing layer, and a semiconductor region of a second conductivity type formed within the cap layer and forming a pn junction with the cap layer. A depletion layer formed around the semiconductor region does not reach the light absorbing layer in a case where a reverse bias is not applied to the pn junction, and exceeds a position amounting to 50% of a thickness of the
(Continued)

light absorbing layer from the cap layer side in a case where a reverse bias of 20 V is applied to the pn junction.

39 Claims, 12 Drawing Sheets

(51) Int. Cl.
*H01L 31/02* (2006.01)
*H01L 31/0216* (2014.01)
*H01L 31/0224* (2006.01)
*H01L 31/0304* (2006.01)
*H01L 31/0352* (2006.01)
*H01L 31/109* (2006.01)

(52) U.S. Cl.
CPC ............ *H01L 31/02161* (2013.01); *H01L 31/022408* (2013.01); *H01L 31/03046* (2013.01); *H01L 31/035272* (2013.01); *H01L 31/109* (2013.01)

(58) Field of Classification Search
CPC ....... H01L 31/03046; H01L 31/035272; H01L 31/109; H01L 27/1463; H01L 27/14643; H01L 31/1035; G01J 1/44; G01S 7/481; G01S 17/08; G01S 17/89
See application file for complete search history.

(56) References Cited

U.S. PATENT DOCUMENTS

| | | | | |
|---|---|---|---|---|
| 2004/0085526 | A1* | 5/2004 | Gogolla | G01S 7/497 356/4.01 |
| 2006/0002439 | A1* | 1/2006 | Lee | H04B 10/07955 372/38.07 |
| 2007/0034898 | A1* | 2/2007 | Tennant | H01L 31/103 257/184 |
| 2012/0286144 | A1* | 11/2012 | Holz | H01L 27/1446 250/214.1 |
| 2014/0217540 | A1* | 8/2014 | Tennant | H01L 31/1032 257/437 |
| 2016/0155880 | A1 | 6/2016 | Iguchi et al. | |
| 2021/0134854 | A1* | 5/2021 | Poikonen | H01L 27/14643 |

FOREIGN PATENT DOCUMENTS

| | | |
|---|---|---|
| JP | H3-230582 A | 10/1991 |
| JP | 2002-231992 A | 8/2002 |
| JP | 2004-241588 A | 8/2004 |
| JP | 2007-311720 A | 11/2007 |
| JP | 2011-133464 A | 7/2011 |
| JP | 2013-224931 A | 10/2013 |
| JP | 2014-077658 A | 5/2014 |

* cited by examiner

LIGHT DETECTION ELEMENT AND LIGHT DETECTION DEVICE

CROSS-REFERENCE TO RELATED APPLICATIONS

This application is a Continuation-In-Part application of PCT/JP2019/027418 claiming the benefit of priority of the Japanese Patent Application No. 2018-195146 filed on Oct. 16, 2018, the entire contents of which are incorporated herein by reference.

TECHNICAL FIELD

The present disclosure relates to a light detection element and a light detection device.

BACKGROUND ART

As a sensor that acquires a distance image of an object using an indirect time of flight (TOF) scheme, a distance image sensor including a semiconductor substrate provided with a photosensitive region, an insulating layer formed on the semiconductor substrate, and a photogate electrode and a transfer electrode formed on the insulating layer for each pixel is known (see, for example, Patent Literature 1). In an example of the distance image sensor disclosed in Patent Literature 1, the semiconductor substrate is formed of silicon, and the photogate electrode and the transfer electrode are formed of polysilicon.

CITATION LIST

Patent Literature

Patent Literature 1: Japanese Unexamined Patent Publication No. 2011-133464

SUMMARY OF INVENTION

Technical Problem

In recent years, a distance image sensor that can be detect light having a wavelength of approximately 1.5 µm has been required for acquiring a distance image of an object, for example, in fog or smoke. However, in a case where a semiconductor substrate constituting the distance image sensor is formed of silicon, it is not possible to obtain sufficient sensitivity to light having a wavelength of approximately 1.5 µm. Consequently, in order to obtain sufficient sensitivity to light having a wavelength of approximately 1.5 µm, using a compound semiconductor substrate for the semiconductor substrate constituting the distance image sensor can be considered. However, in that case, it is difficult to form a photogate electrode and a transfer electrode on the compound semiconductor substrate.

In addition, performing control of output (control of transfer) of a detection signal in a CMOS provided at a latter stage of a distance image sensor can also be considered. However, since there is a limit to control of output of a detection signal on the order of µs in the CMOS, the control of output of a detection signal in the CMOS is insufficient for an indirect TOF scheme requiring control of output of a detection signal at a high speed such as on the order of several tens of ns.

An object of the present disclosure is to provide a light detection element and a light detection device that make it possible to realize control of output of a detection signal at a high speed with a simple configuration.

Solution to Problem

According to an aspect of the present disclosure, there is provided a light detection element including: a semiconductor substrate; a light absorbing layer of a first conductivity type formed on the semiconductor substrate; a cap layer of a first conductivity type formed on the light absorbing layer; and a first semiconductor region of a second conductivity type formed within the cap layer and forming a pn junction with the cap layer, wherein a depletion layer formed around the semiconductor region does not reach the light absorbing layer in a case where a reverse bias is not applied to the pn junction, and exceeds a position amounting to 50% of a thickness of the light absorbing layer from the cap layer side in a case where a reverse bias of 20 V is applied to the pn junction.

According to an aspect of the present disclosure, there is provided a light detection device including: the above-described light detection element; and a signal processing unit configured to apply a voltage signal to the pn junction, and to acquire a detection signal output from the light detection element, wherein the voltage signal is a voltage signal including a first voltage at which the depletion layer does not reach the light absorbing layer and a second voltage at which the depletion layer reaches the light absorbing layer.

Advantageous Effects of Invention

According to the present disclosure, it is possible to provide a light detection element and a light detection device that make it possible to realize control of output of a detection signal at a high speed with a simple configuration.

DESCRIPTION OF EMBODIMENTS

Figure 1:
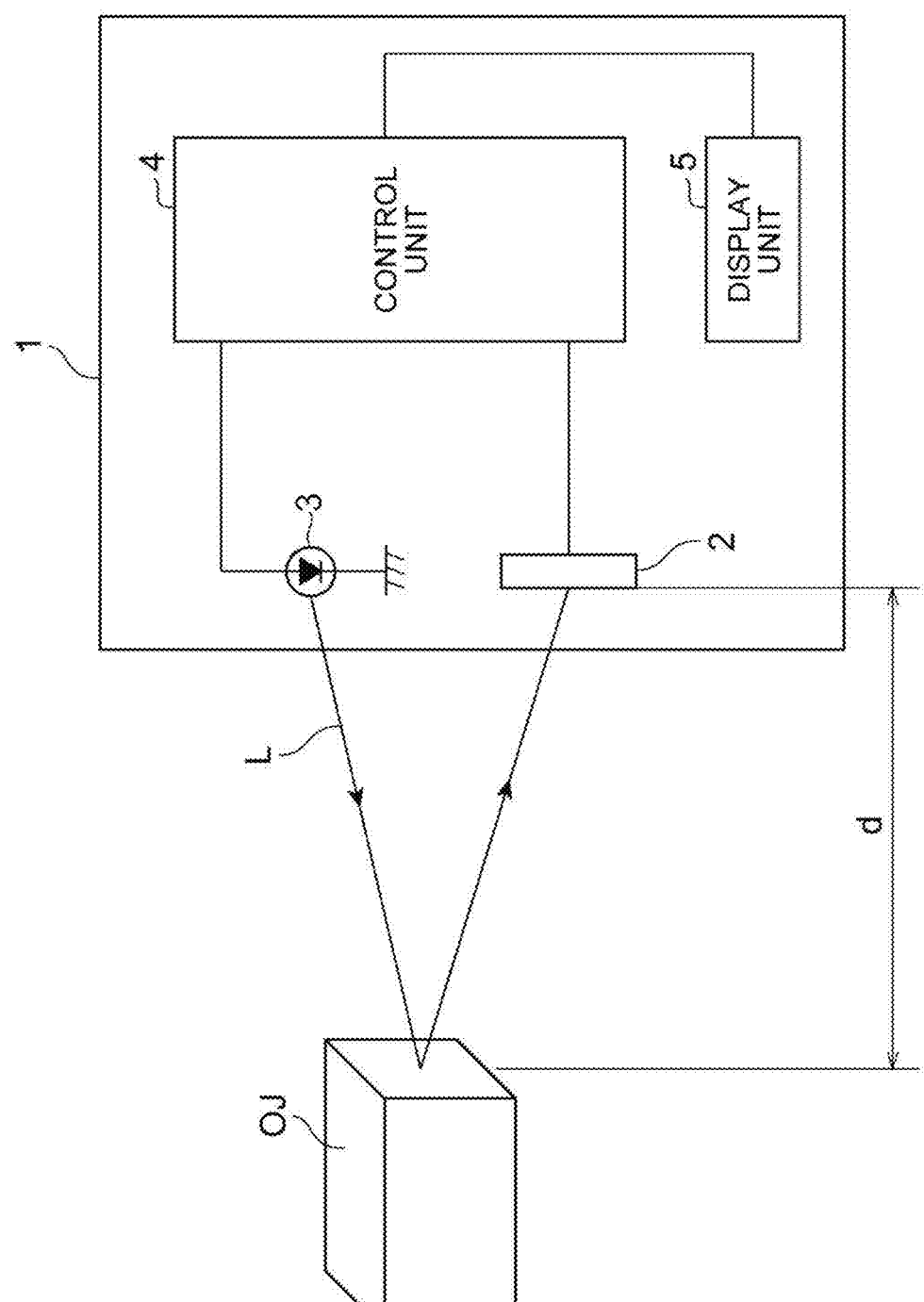
FIG. 1 is a configuration diagram of a light detection device of an embodiment.

Hereinafter, an embodiment of the present disclosure will be described in detail with reference to the accompanying drawings. Meanwhile, the same or equivalent portions in the drawings are denoted by the same reference numerals and signs, and thus description thereof will not be repeated.

As shown in FIG. 1, a light detection device 1 includes a light detection unit 2, a light source 3, a control unit 4, and a display unit 5. The light detection device 1 is a device that acquires a distance image of an object OJ (an image including information relating to a distance d to an object OJ) using an indirect TOF scheme.

Figure 2:
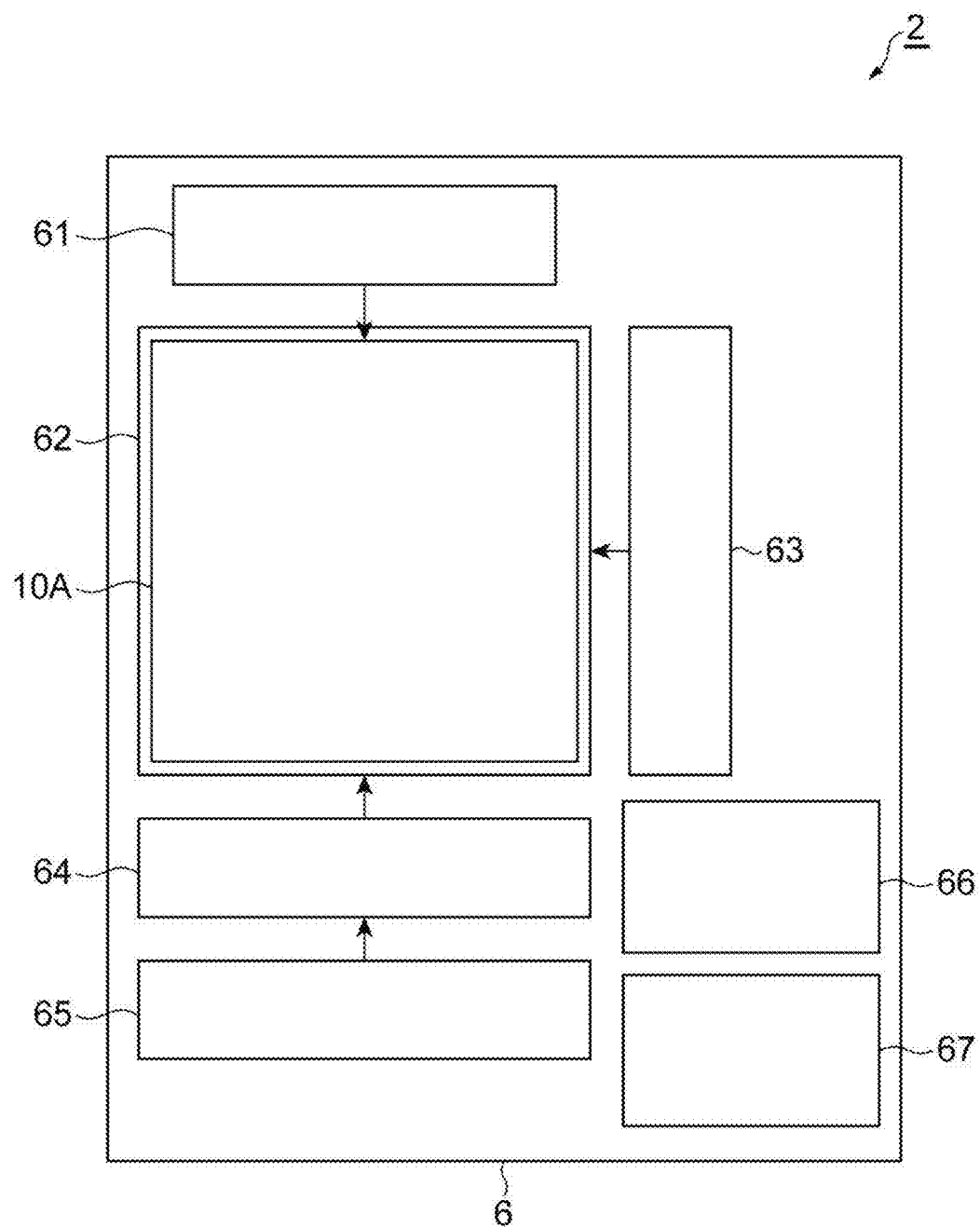
FIG. 2 is a configuration diagram of a light detection unit shown in FIG. 1.

As shown in FIG. 2, the light detection unit 2 includes a signal processing circuit (signal processing unit) 6 and a light detection element 10A. The signal processing circuit 6 includes a voltage signal generation circuit 61, a CMOS readout circuit 62, a vertical scanning circuit 63, a column circuit 64, a horizontal scanning circuit 65, an amplifier 66, and a timing generation circuit 67. In the present embodiment, the light detection element 10A is an InGaAs area sensor of a rear surface incident type, and is connected by a bump on the CMOS readout circuit 62.

The voltage signal generation circuit 61 generates a pulse voltage signal and applies the generated signal to the light detection element 10A. The CMOS readout circuit 62 is constituted by a plurality of charge amplifiers and the like, and integrates a signal current in each charge amplifier in a case where a detection signal is output from each pixel of the light detection element 10A.

The vertical scanning circuit 63 sequentially selects the plurality of charge amplifiers of the CMOS readout circuit 62 for each row. The column circuit 64 samples and holds a signal voltage integrated in each charge-up of the selected row together with a reset voltage. The horizontal scanning circuit 65 sequentially transfers a voltage difference between the signal voltage and the reset voltage sampled and held in the column circuit 64 to the amplifier 66.

The amplifier 66 amplifies the voltage difference between the signal voltage and the reset voltage sequentially transferred from the column circuit 64, and outputs the amplified voltage difference, as an output voltage signal, to the control unit 4 (see FIG. 1). The timing generation circuit 67 controls operation timings of the voltage signal generation circuit 61, the vertical scanning circuit 63 and the horizontal scanning circuit 65. Meanwhile, the amplifier 66 is provided in the case of analog output, but an AD converter is provided instead of the amplifier 66 in the case of digital output.

Figure 3:
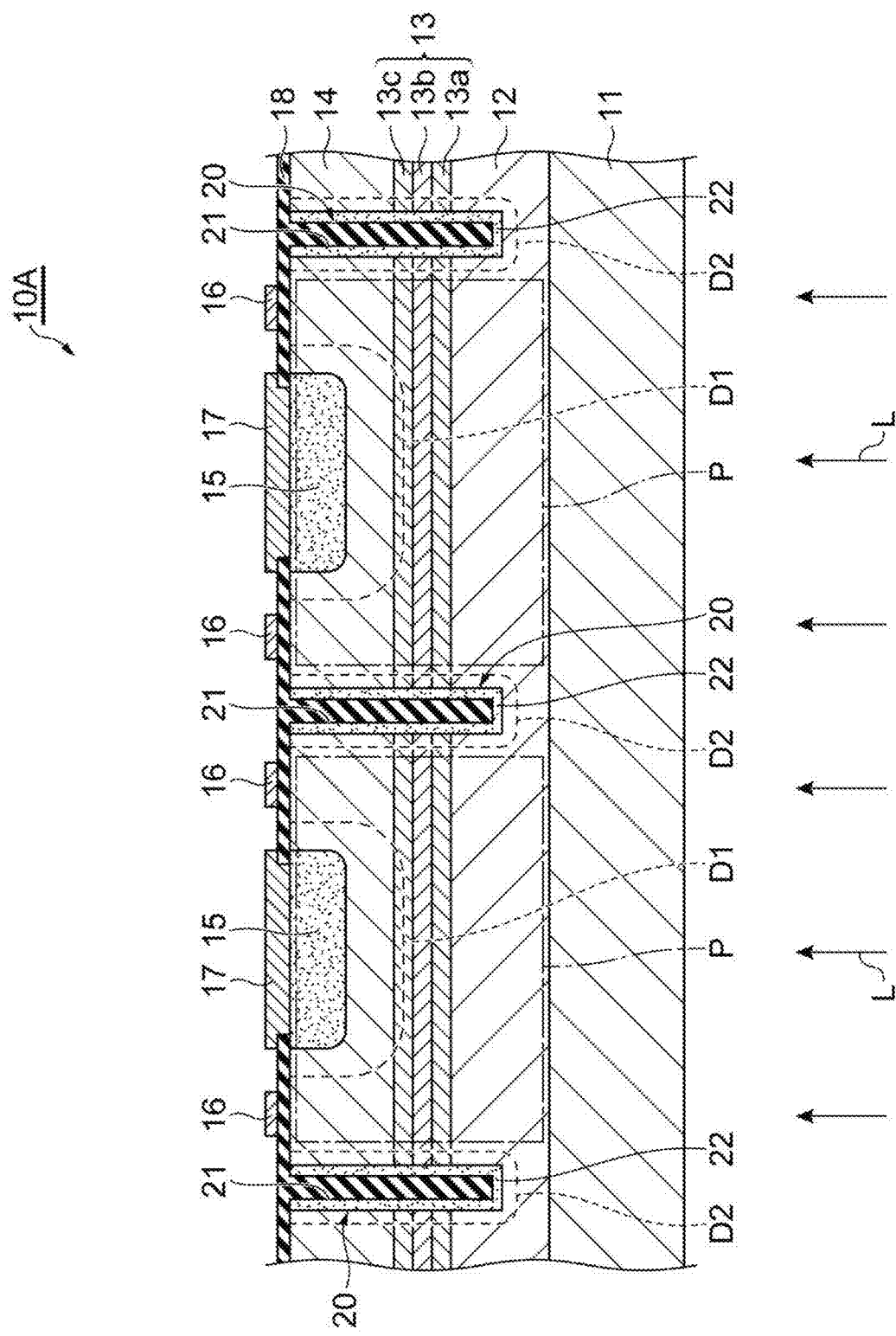
FIG. 3 is a cross-sectional view of a portion of a light detection element shown in FIG. 2.

As shown in FIG. 3, the light detection element 10A includes a semiconductor substrate 11 of an n-type (a first conductivity type), a light absorbing layer 12 of an n-type, a relaxation layer 13 of an n-type, a cap layer 14 of an n-type, and a plurality of semiconductor regions (first semiconductor regions) 15 of a p-type (a second conductivity type). The light absorbing layer 12 is formed on the semiconductor substrate 11, for example, by epitaxial growth. The relaxation layer 13 is formed on the light absorbing layer 12, for example, by epitaxial growth. The cap layer 14 is formed on the relaxation layer 13, for example, by epitaxial growth.

The relaxation layer 13 is constituted by a plurality of layers 13a, 13b, and 13c, and is formed between the light absorbing layer 12 and the cap layer 14. The bandgap of each of the layers 13a, 13b, and 13c is set to relax a difference between the bandgap of the light absorbing layer 12 and the bandgap of the cap layer 14. In a case where the difference between the bandgap of the light absorbing layer 12 and the bandgap of the cap layer 14 can be relaxed, the relaxation layer 13 may be constituted by one layer. By providing the relaxation layer 13 in this manner, there is more of tendency for the cap layer 14 to be formed than in a case where the cap layer 14 is formed directly on the light absorbing layer 12.

The plurality of semiconductor regions 15 are formed within the cap layer 14, for example, by thermal diffusion, ion implantation, or the like. The plurality of semiconductor regions 15 are arranged two-dimensionally (for example, in a matrix) when viewed from the thickness direction of the semiconductor substrate 11. Each of the semiconductor regions 15 is formed along the surface of the cap layer 14 located on the opposite side of the semiconductor substrate 11, and is separated from the surface of the cap layer 14 on the semiconductor substrate 11 side. Each of the semiconductor regions 15 forms a pn junction with the cap layer 14, and constitutes a pixel P. A depletion layer D1 is formed around each of the semiconductor regions 15. Meanwhile, the semiconductor region 15 is, for example, an impurity region having an impurity concentration of $1\times10^{17}$ $cm^{-3}$ or greater.

In the present embodiment, the semiconductor substrate 11 is an $n^+$-InP substrate having a carrier concentration of 0.5 to $5\times10^{18}$ $cm^{-3}$ (for example, approximately $1\times10^{18}$ $cm^{-3}$), and the thickness thereof is 150 to 300 μm (for example, approximately 200 μm). The light absorbing layer 12 is an $n^-$-InGaAs layer having a carrier concentration of 3 to $10\times10^{14}$ $cm^{-3}$ (for example, approximately $5\times10^{14}$ $cm^{-3}$), and the thickness thereof is 1 to 5 μm (for example, approximately 2 μm). The relaxation layer 13 is an $n^-$-InGaAsP layer having a carrier concentration of 0.3 to $5\times10^{15}$ $cm^{-3}$ (for example, approximately $1\times10^{15}$ $cm^{-3}$), and the thickness thereof is 0.1 to 0.6 μm (for example, approximately 0.2 μm). The cap layer 14 is an $n^-$-InP layer having a carrier concentration of 0.3 to $5\times10^{15}$ $cm^{-3}$ (for example, approximately $1\times10^{15}$ $cm^{-3}$), and the thickness thereof is 1 to 2 μm (for example, approximately 1.5 μm). Each of the semiconductor regions 15 is a $p^+$ region having a carrier concentration of 0.1 to $10\times10^{18}$ $cm^{-3}$ (for example, approximately $1\times10^{18}$ $cm^{-3}$), and the thickness thereof is 0.1 to 1 μm (for example, approximately 0.5 μm).

The light detection element 10A further includes a plurality of first electrodes 16 and a plurality of second electrodes 17. The first electrodes 16 and the second electrodes 17 are formed on an insulating film 18 formed on the surface of the cap layer 14 located on the opposite side of the semiconductor substrate 11. The first electrodes 16 and the second electrodes 17 are formed of, for example, Ti, Pt, Cr, Ni, Au, an alloy thereof, or the like. The insulating film 18 is, for example, a silicon nitride film, a silicon oxide film, or the like.

Each of the first electrodes 16 extends into a groove (or through-hole) formed in the light absorbing layer 12, the relaxation layer 13, the cap layer 14 and the insulating film 18, and electrically contacts the light absorbing layer 12, the relaxation layer 13 and the cap layer 14. The groove (or through-hole) is formed not to influence the depletion layer D1. Each of the second electrodes 17 extends into an opening (or through-hole) formed in the insulating film 18, and electrically contacts one of the semiconductor regions 15. Since the first electrode 16 functions as a common electrode, at least one may be provided for a plurality of pixels P. Since the second electrode 17 functions as an individual electrode, one needs to be provided for one pixel P. Meanwhile, in a case where the groove (or though-hole) into which each of the first electrodes 16 extends is formed not to influence the depletion layer D1, the groove may reach any of the semiconductor substrate 11, the light absorbing layer 12, the relaxation layer 13 and the cap layer 14.

The light absorbing layer 12, the relaxation layer 13 and the cap layer 14 are provided with pixel separation portions 20. Each of the pixel separation portion 20 extends to pass between pixels P which are next to each other (that is, to pass between the semiconductor regions 15 which are next to each other). In a case where a plurality of semiconductor regions 10a are arranged in a matrix, the pixel separation portion 20 extends in a lattice shape.

The pixel separation portion 20 is configured by a semiconductor region 22 (a second semiconductor region) of a p-type being formed along the inner surface of a groove 21 formed in the light absorbing layer 12, the relaxation layer 13 and the cap layer 14. A depletion layer D2 is formed around the semiconductor region 22. The pixel separation portion 20 (that is, the groove 21 and the semiconductor region 22) reaches the lateral side of the light detection element 10A, and the semiconductor region 22 is short-circuited on the lateral side. Meanwhile, the inner surface of the groove 21 is covered with the insulating film 18.

That is, the semiconductor region 22 is formed in the cap layer 14 so as to surround each of the semiconductor regions 15 when viewed from the thickness direction of the semiconductor substrate 11. In the present embodiment, the semiconductor region 22 is formed along the inner surface of the groove 21 formed in the cap layer 14 so as to surround each of the semiconductor regions 15 when viewed from the thickness direction of the semiconductor substrate 11. The groove 21 may reach the light absorbing layer 12, or may reach the relaxation layer 13 without reaching the light absorbing layer 12.

Meanwhile, for example, in a case where a plurality of semiconductor region 15 are arranged one-dimensionally within the cap layer 14, the semiconductor region 22 may be formed in the cap layer 14 so as to be located between the semiconductor regions 15 which are next to each other when viewed from the thickness direction of the semiconductor substrate 11. In the present embodiment, the semiconductor region 22 may be formed along the inner surface of the groove 21 formed in the cap layer 14 so as to be located between the semiconductor regions 15 which are next to each other when viewed from the thickness direction of the semiconductor substrate 11. In that case, the groove 21 may reach the light absorbing layer 12, or may reach the relaxation layer 13 without reaching the light absorbing layer 12.

Figure 4:
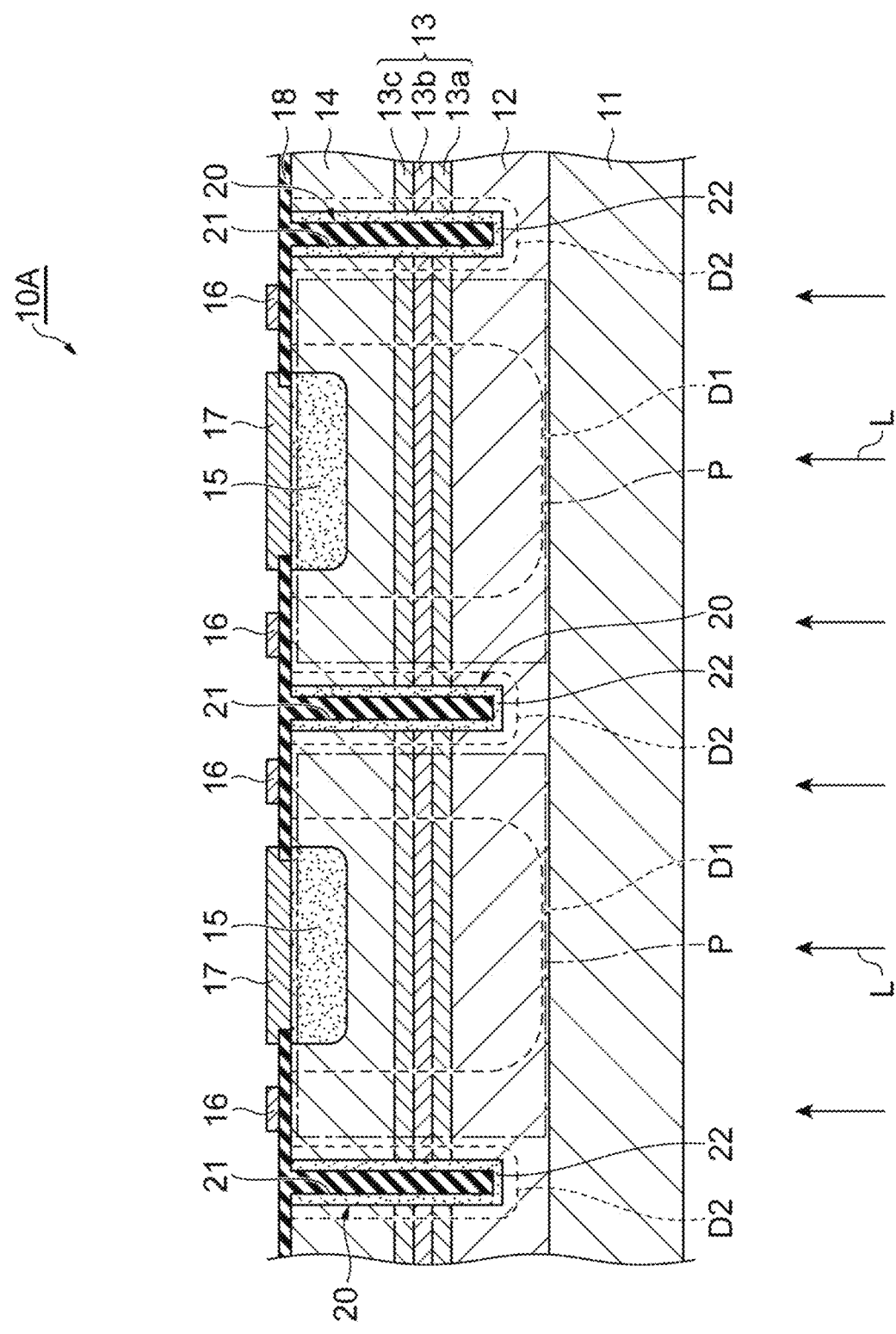
FIG. 4 is a cross-sectional view of a portion of the light detection element shown in FIG. 2.

In each pixel P, the depletion layer D1 formed around the semiconductor region 15 does not reach the light absorbing layer 12 in a case where a reverse bias is not applied between the first electrode 16 and the second electrode 17 (in an unbiased state). On the other hand, in a case where a reverse bias of 20 V is applied between the first electrode 16 and the second electrode 17, the depletion layer D1 exceeds a position amounting to 80% of the thickness of the light absorbing layer 12 from the cap layer 14 side (a position amounting to 80% of the thickness of the light absorbing layer 12 from the surface of the light absorbing layer 12 on the cap layer 14 side with the surface used as a reference) as shown in FIG. 4. Meanwhile, the wording "a reverse bias is applied or is not applied between the first electrode 16 and the second electrode 17" is synonymous with "a reverse bias is applied or is not applied to a pn junction where the semiconductor region 15 serves as the cap layer 14" (the same shall apply hereinafter).

In the present embodiment, since the first electrode 16 is an n-type side electrode and the second electrode 17 is a p-type side electrode, a reverse bias is applied between the first electrode 16 and the second electrode 17 so that the potential of the second electrode 17 is set to −20 V with the potential of the first electrode 16 used as a reference. In addition, in the present embodiment, as shown in FIG. 3, the depletion layer D1 reaches the layer 13c of the relaxation layer 13 in an unbiased state, but the depletion layer D1 may reach the other layers 13a and 13b of the relaxation layer 13 when not reaching the light absorbing layer 12 in an unbiased state, or may not reach the relaxation layer 13 (that is, may fall within the cap layer 14).

Here, setting of various parameters of the light detection element 10A will be described. In a case where the depletion layer D1 reaches the layer 13c of the relaxation layer 13 in an unbiased state, a reverse bias V required for the depletion layer D1 to reach the light absorbing layer 12 is represented by Expression (1) assuming that the semiconductor region 15 is in the state of one-sided abrupt junction.

[Expression 1]

$$V = \frac{qN1}{2\varepsilon r1\varepsilon 0}W1^2 + \frac{qN2}{2\varepsilon r2\varepsilon 0}W2^2 + \frac{qN3}{2\varepsilon r3\varepsilon 0}W3^2 \quad (1)$$

In Expression (1), W1 is a distance between the depletion layer D1 and the surface of the layer 13c on the light absorbing layer 12 side, W2 is the thickness of the layer 13b, and W3 is the thickness of the layer 13a. In addition, εr1 is the relative dielectric constant of the layer 13c, εr2 is the relative dielectric constant of the layer 13b, and εr3 is the relative dielectric constant of the layer 13a. N1 is the carrier concentration of the layer 13c, N2 is the carrier concentration of the layer 13b, and N3 is the carrier concentration of the layer 13a. In addition, q is charge, and ε0 is an electric constant.

Therefore, in a case where a reverse bias is not applied between the first electrode 16 and the second electrode 17, a condition in which the depletion layer D1 does not reach the light absorbing layer 12 is represented by Expression (2).

[Expression 2]

$$0 < \frac{qN1}{2\varepsilon r1\varepsilon 0}W1^2 + \frac{qN2}{2\varepsilon r2\varepsilon 0}W2^2 + \frac{qN3}{2\varepsilon r3\varepsilon 0}W3^2 \quad (2)$$

In addition, in a case where the depletion layer D1 reaches the layer 13c of the relaxation layer 13 in an unbiased state, a reverse bias V required for the depletion layer D1 to reach a position amounting to X % of the thickness of the light absorbing layer 12 from the cap layer 14 side (a position amounting to X % of the thickness of the light absorbing layer 12 from the surface of the light absorbing layer 12 on the cap layer 14 side with the surface used as a reference) is represented by Expression (3) assuming that the semiconductor region 15 is in the state of one-sided abrupt junction. In Expression (3), Wab is the thickness of the light absorbing layer 12, εrab is the relative dielectric constant of the light absorbing layer 12, and Nab is the carrier concentration of the light absorbing layer 12.

[Expression 3]

$$V = \frac{qN1}{2\varepsilon r1\varepsilon 0}W1^2 + \frac{qN2}{2\varepsilon r2\varepsilon 0}W2^2 + \frac{qN3}{2\varepsilon r3\varepsilon 0}W3^2 + \frac{X}{100} \times \frac{qNab}{2\varepsilon rab\varepsilon 0}Wab^2 \quad (3)$$

Therefore, in a case where a reverse bias of 20 V is applied between the first electrode 16 and the second electrode 17, a condition in which the depletion layer D1 exceeds a position amounting to 80% of the thickness of the light absorbing layer 12 from the cap layer 14 side is represented by Expression (4).

[Expression 4]

$$20 \geq \frac{qN1}{2\varepsilon r1\varepsilon 0}W1^2 + \frac{qN2}{2\varepsilon r2\varepsilon 0}W2^2 + \frac{qN3}{2\varepsilon r3\varepsilon 0}W3^2 + \frac{80}{100} \times \frac{qNab}{2\varepsilon rab\varepsilon 0}Wab^2 \quad (4)$$

In the present embodiment, various parameters of the light detection element 10A are set so that Expression (2) and Expression (4) are satisfied. Particularly, in the present embodiment, in a case where a reverse bias of 5 V is applied between the first electrode 16 and the second electrode 17, the depletion layer D1 reaches a position amounting to 100% of thickness of the light absorbing layer 12 from the cap layer 14 side. That is, in the present embodiment, various parameters of the light detection element 10A are set so that Expression (5) is satisfied.

[Expression 5]

$$5 \geq \frac{qN1}{2\varepsilon r1\varepsilon 0}W1^2 + \frac{qN2}{2\varepsilon r2\varepsilon 0}W2^2 + \frac{qN3}{2\varepsilon r3\varepsilon 0}W3^2 + \frac{100}{100} \times \frac{qNab}{2\varepsilon rab\varepsilon 0}Wab^2 \quad (5)$$

Meanwhile, in a case where the depletion layer D1 does not reach the relaxation layer 13 in an unbiased state (that is, falls within the cap layer 14), an item of the cap layer 14 may be added to the right sides of Expression (1) to Expression (5). In that case, when the relaxation layer 13 is not present, an item relating to the relaxation layer 13 may be subtracted from the right sides of Expression (1) to Expression (5). In this manner, an item corresponding to each layer may be added to or subtracted from the right sides of Expression (1) to Expression (5) in accordance with the layer structure of the light detection element 10A or the like.

As shown in FIG. 1, the light source 3 outputs pulsed light L to which the light detection element 10A is sensitive (that is, by which photoelectric conversion can be generated in the light detection element 10A) at a frequency of 10 KHz or higher. In the present embodiment, the light source 3 is, for example, an infrared LED or the like, and outputs pulsed light L having a wavelength of approximately 1.5 μm. The pulsed light L output from the light source 3 is radiated to the object OJ, and the pulsed light L reflected from the object OJ is incident on the light detection element 10A. The control unit 4 controls the light detection unit 2 and the light source 3, generates a distance image of the object OJ on the basis of an output voltage signal which is output from the light detection unit 2, and causes the display unit 5 to display the generated distance image.

As described above, in the light detection element 10A, in a case where a reverse bias is not applied between the first electrode 16 and the second electrode 17, the depletion layer D1 does not reach the light absorbing layer 12. Thereby, even when carriers (electrons and holes) have been generated in the light absorbing layer 12 due to the incidence of the pulsed light L, a current does not flow between the first electrode 16 and the second electrode 17. That is, for example, a reverse bias is not applied between the first electrode 16 and the second electrode 17, so that it is possible not to output a detection signal from the light detection element 10A to the signal processing circuit 6. On the other hand, in a case where a reverse bias of 20 V is applied between the first electrode 16 and the second electrode 17, the depletion layer D1 exceeds a position amounting to 80% of the thickness of the light absorbing layer 12 from the cap layer 14 side. Thereby, in a case where carriers are generated in a region of the light absorbing layer 12 in which the depletion layer D1 spreads due to the incidence of the pulsed light L, a current flows between the first electrode 16 and the second electrode 17. That is, for example, a reverse bias of 20 V is applied between the first electrode 16 and the second electrode 17, so that it is possible to output a detection signal from the light detection element 10A to the signal processing circuit 6. Here, the potential difference of 20 V is a potential difference which is not likely to influence the design of the latter-stage signal processing circuit 6, and is a potential difference by which modulation at a high speed such as on the order of several tens of ns is possible. Thus, according to the light detection element 10A, it is possible to realize control of output of a detection signal at a high speed with a simple configuration.

Particularly, in the light detection element 10A, in a case where a reverse bias of 5 V is applied between the first electrode 16 and the second electrode 17, the depletion layer D1 reaches a position amounting to 100% of the thickness of the light absorbing layer 12 from the cap layer 14 side. Since the light detection element 10A is an area sensor of a rear surface incident type for causing light to be incident from the semiconductor substrate 11 side, the depletion layer D1 reaching the surface of the light absorbing layer 12 on the light incident side by the application of a reverse bias of 5 V is effective in achieving an improvement in sensitivity and responsiveness.

Meanwhile, an avalanche photodiode is also an element that detects light by the application of a reverse bias, but is basically different from the light detection element 10A, in that a potential difference as high as, for example, 50 V is required as a reverse bias. In the avalanche photodiode, in order to increase the intensity of an electric field which is applied to the cap layer having a multiplication layer formed thereon, and to decrease the intensity of an electric field which is applied to the light absorbing layer, electric field suppression layer is formed between the light absorbing layer and the cap layer. On the other hand, in the light detection element 10A, in order to decrease the intensity of an electric field which is applied to the cap layer 14, and to increase the intensity of an electric field which is applied to the light absorbing layer 12, an electric field suppression layer is not formed between the light absorbing layer 12 and the cap layer 14. Meanwhile, the potential difference of 50 V is a potential difference that has a tendency to influence the design of a latter-stage circuit such as a CMOS, and is a potential difference by which modulation at a high speed such as on the order of several tens of ns is impossible.

In addition, in the light detection element 10A, the relaxation layer 13 of an n-type is formed between the light absorbing layer 12 and the cap layer 14. Thereby, it is possible to smoothly move carriers generated in a region of the light absorbing layer 12 in which the depletion layer D1 spreads.

In addition, in the light detection element 10A, the plurality of semiconductor regions 15 are arranged two-dimensionally within the cap layer 14 when viewed from the thickness direction of the semiconductor substrate 11. Thereby, it is possible to acquire a distance image of the object OJ.

In addition, in the light detection element 10A, the light absorbing layer 12, the relaxation layer 13 and the cap layer 14 are provided with the pixel separation portion 20. Thereby, it is possible to suppress the generation of crosstalk between pixels P which are next to each other. In addition, even when carriers are generated in the light absorbing layer 12 in an unbiased state, the carriers are trapped by the depletion layer D2 formed around the semiconductor region 22. Therefore, on the occasion of being switched from an unbiased state to a reverse bias application state, it is possible to prevent the carriers generated in the light absorbing layer 12 in an unbiased state from acting on noise.

In addition, in the light detection element 10A, the carrier concentrations of the light absorbing layer 12, the relaxation layer 13 and the cap layer 14 are set to be equal to or less than $1\times10^{16}$ cm$^{-3}$. Thereby, it is possible to smoothly spread the depletion layer D1 to the light absorbing layer 12 by the application of a reverse bias having a potential difference of 20 V or lower.

In addition, the light detection device 1 applies a pulse voltage signal between the light detection element 10A, the first electrode 16 and the second electrode 17, and includes the signal processing circuit 6 that acquires a detection signal which is output from the light detection element 10A and the light source 3 that outputs the pulsed light L to which the light detection element 10A is sensitive at a frequency of 10 KHz or higher. Thereby, it is possible to appropriately acquire information relating to the distance d to the object OJ as in a calculation example to be described next.

Figure 5:
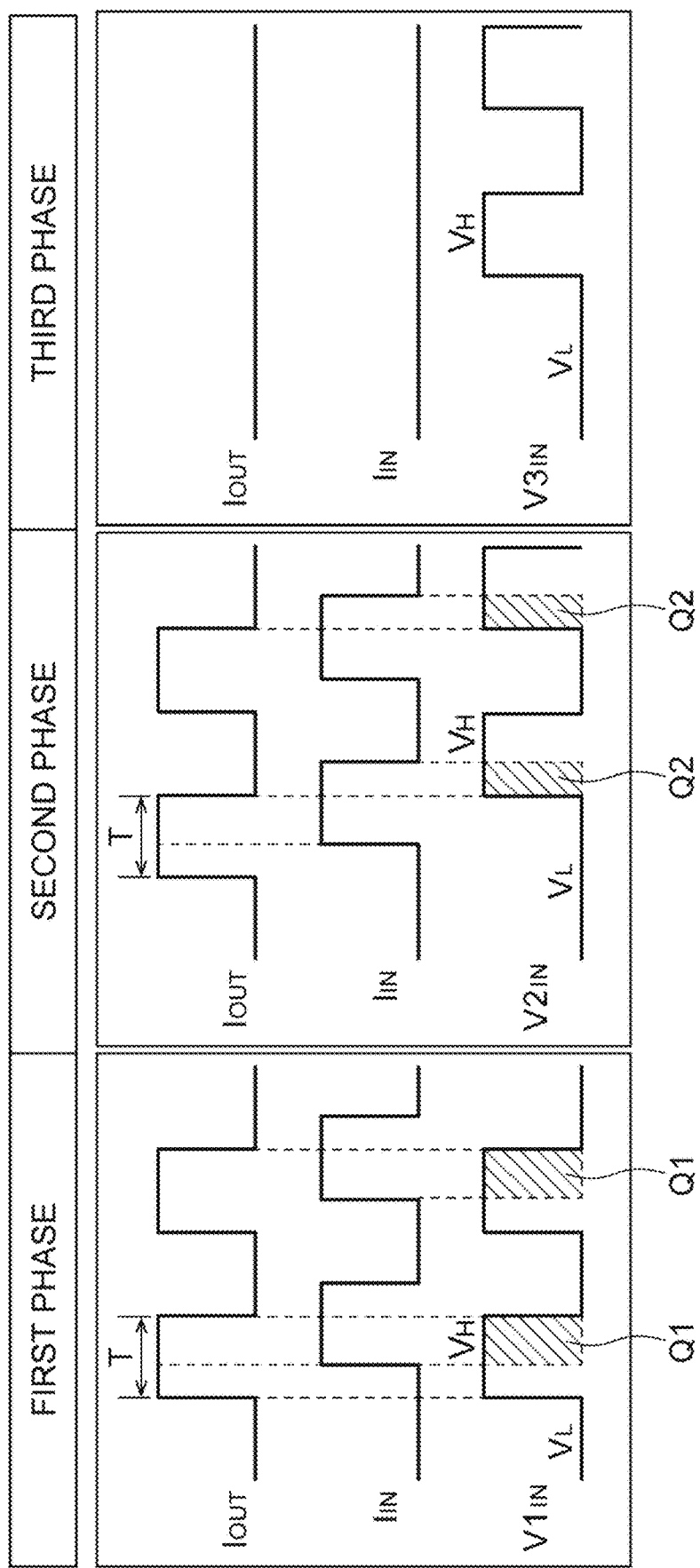
FIG. 5 is a timing diagram for acquiring information relating to a distance to an object.

A calculation example of the distance d to the object OJ will be described with reference to FIG. 5. FIG. 5 shows an intensity signal $I_{OUT}$ of the pulsed light L which is output from the light source 3, an intensity signal $I_{IN}$ of the pulsed light L which is reflected from the object OJ and is incident on the light detection element 10A, a pulse voltage signal $V1_{IN}$ which is applied to the light detection element 10A (specifically, between the first electrode 16 and the second electrode 17) in a first phase, a pulse voltage signal $V2_{IN}$ which is applied to the light detection element 10A in a second phase, and a pulse voltage signal $V3_{IN}$ which is applied to the light detection element 10A in a third phase. Meanwhile, in this calculation example, attention is focused on any one pixel P.

In the first phase, an output voltage signal $V1_{OUT}$ is acquired in a state in which the pulsed light L is output from the light source 3 with the intensity signal $I_{OUT}$ and the pulse voltage signal $V1_{IN}$ is applied to the light detection element 10A. The pulse width T of the intensity signal $I_{OUT}$ is set in accordance with a distance to be measured like, for example, 30 ns (measurable distance: ~4.5 m), 40 ns (measurable distance: ~6.0 m), or 60 ns (measurable distance: ~9.0 m). The pulse voltage signal $V1_{IN}$ is a voltage signal in which a first voltage $V_L$ at which the depletion layer D1 does not reach the light absorbing layer 12 and a second voltage $V_H$ at which the depletion layer D1 reaches the light absorbing layer 12 are alternately repeated, and is a voltage signal which has the same period, pulse width and phase as the intensity signal $I_{OUT}$. The first voltage $V_L$ is 0 V in the present embodiment. The second voltage $V_H$ is a voltage at which the depletion layer D1 reaches a position amounting to 100% of the thickness of the light absorbing layer 12 from the cap layer 14 side, and is 5 V in the present embodiment. In this case, since the light detection element 10A outputs a detection signal only for a period in which the second voltage $V_H$ is applied, the output voltage signal $V1_{OUT}$ corresponds to an integrated value of the amount of charge Q1 at a portion where the pulse of the intensity signal $I_{IN}$ and the pulse of the pulse voltage signal $V1_{IN}$ overlap each other.

In the second phase, an output voltage signal $V2_{OUT}$ is acquired in a state in which the pulsed light L is output from the light source 3 with the intensity signal $I_{OUT}$ and the pulse voltage signal $V2_{IN}$ is applied to the light detection element 10A. The pulse voltage signal $V2_{IN}$ is the same voltage signal as the pulse voltage signal $V1_{IN}$ except that its phase is shifted by 180°. In this case, since the light detection element 10A outputs a detection signal only for a period in which the second voltage $V_H$ is applied, the output voltage signal $V2_{OUT}$ corresponds to an integrated value of the amount of charge Q2 at a portion where the pulse of the intensity signal $I_{IN}$ and the pulse of the pulse voltage signal $V2_{IN}$ overlap each other.

In the third phase, an output voltage signal $V3_{OUT}$ is acquired in a state in which the pulsed light L is not output from the light source 3 and the pulse voltage signal $V3_{IN}$ is applied to the light detection element 10A. In this case, since the light detection element 10A outputs a detection signal only for a period in which the second voltage $V_H$ is applied, the output voltage signal $V3_{OUT}$ corresponds to an integrated value of the amount of charge at a portion where the intensity signal of disturbance light, if any, and the pulse of the pulse voltage signal $V3_{IN}$ overlap each other.

In a case where the first phase, the second phase and the third phase described above are performed for each pixel P, the control unit 4 calculates the distance d to the object OJ on the basis of the output voltage signals $V1_{OUT}$, $V2_{OUT}$, and $V3_{OUT}$ for each pixel P. The distance d is represented by Expression (6). In Expression (6), c is the speed of light.

[Expression 6]

$$d = \frac{c}{2} \times T \times \frac{(V2_{OUT} - V3_{OUT})}{(V1_{OUT} - V3_{OUT}) + (V2_{OUT} - V3_{OUT})} \qquad (6)$$

As described above, in the light detection device 1, it is possible to bring the light detection element 10A into switching operation (fluctuation operation) in the order of several tens of ns. In addition, in the light detection device 1, the second voltage $V_H$ of each of the output voltage signals $V1_{OUT}$ and $V2_{OUT}$ is a voltage at which the depletion layer D1 reaches a position amounting to 100% of the thickness of the light absorbing layer 12 from the cap layer 14 side. Thereby, it is possible to prevent carriers generated in a region of the light absorbing layer 12 in which the depletion layer D1 does not spread from being detected as a delay component, and to prevent the accuracy of calculation of the distance d from deteriorating. In addition, in the light detection device 1, the light source 3 is a light source that emits the pulsed light L having a wavelength of approximately 1.5 μm, and the light detection element 10 is an InGaAs area sensor with sufficient sensitivity to the pulsed light L having a wavelength of approximately 1.5 μm. Thereby, it becomes easier to acquire a distance image of the object OJ, for example, even in fog or smoke. Meanwhile, the above-described calculation example is merely an example, and the information relating to the distance d to the object OJ can be acquired by various known calculations. In addition, the second voltage $V_H$ may be a voltage of 20 V or lower (preferably a voltage of 10 V or lower, more preferably a voltage of 5 V or lower). In that case, it is possible to more reliably achieve an improvement in sensitivity and responsiveness in the light detection device 1.

Figure 6:
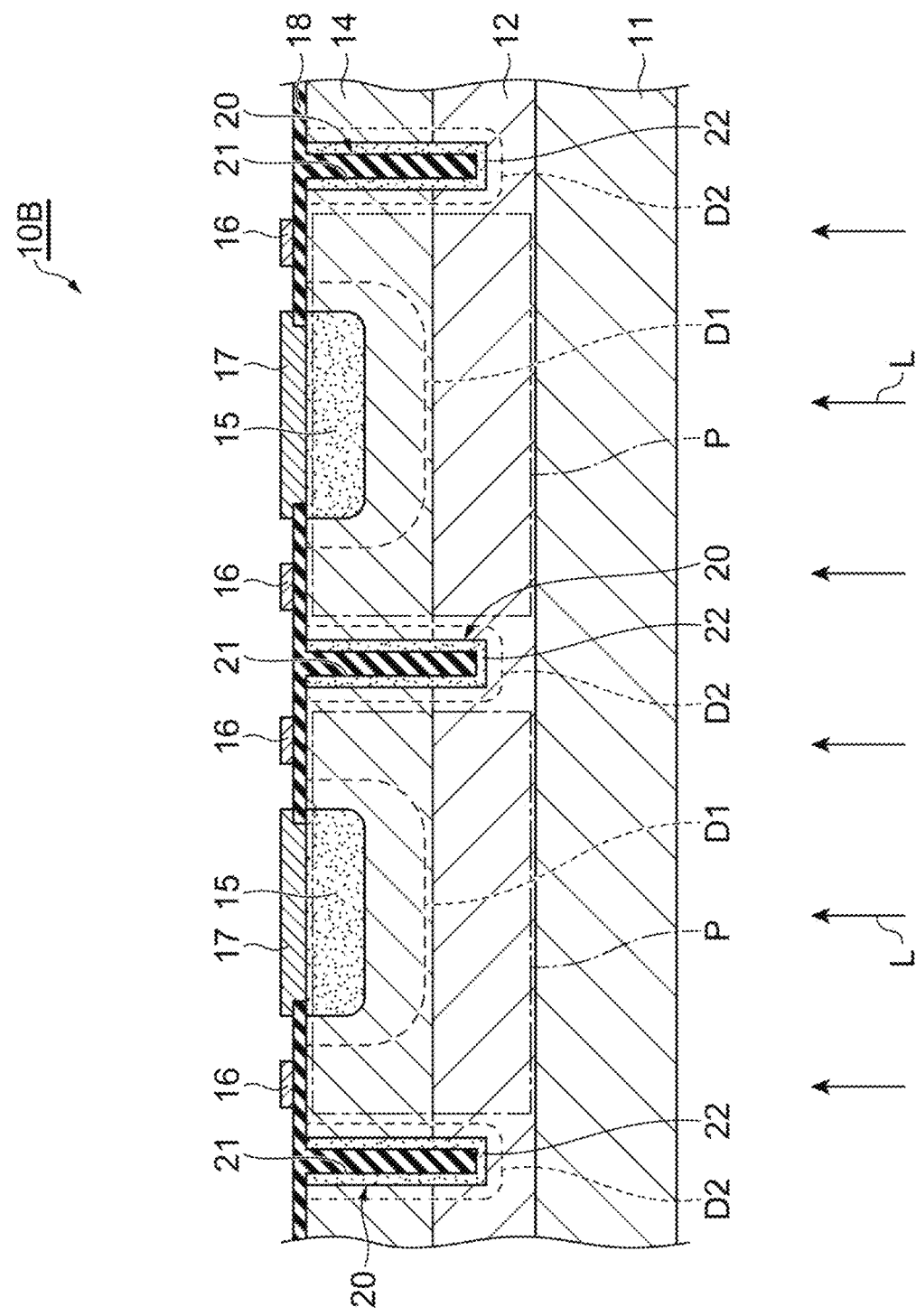
FIG. 6 is a cross-sectional view of a portion of a light detection element of a modification example.
Figure 7:
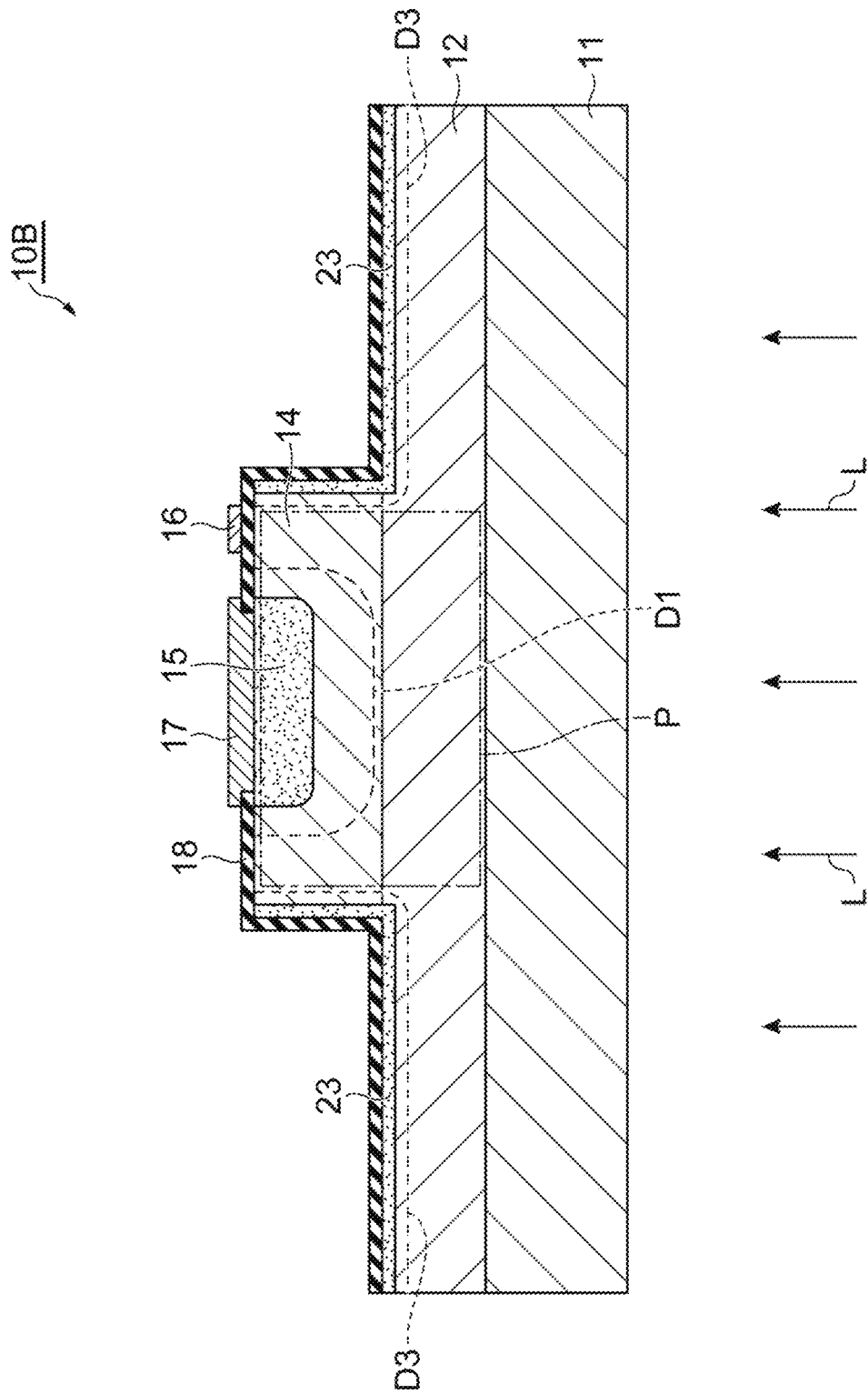
FIG. 7 is another cross-sectional view of the light detection element of the modification example.

The present disclosure is not limited to the above-described embodiment. For example, the light detection element 10A may be configured as a linear sensor in which the plurality of semiconductor regions 15 are arranged one-dimensionally within the cap layer 14. FIGS. 6 and 7 show a light detection element 10B configured as an InGaAs linear sensor of a rear surface incident type. Meanwhile, FIG. 6 is a cross-sectional view of a portion of the light detection element 10B along a surface parallel to the arrangement direction of the plurality of semiconductor regions 15 (hereinafter simply referred to as the "arrangement direction"), and FIG. 7 is a cross-sectional view of the light detection element 10B along a surface perpendicular to the arrangement direction.

The light detection element 10B is mainly different from the above-described the light detection element 10A, in that the relaxation layer 13 of an n-type is not formed between the light absorbing layer 12 and the cap layer 14, and that a semiconductor region (a third semiconductor region) 23 of a p-type is formed therebetween. In the light detection element 10B, as shown in FIG. 7, in a width direction perpendicular to both the thickness direction of the semiconductor substrate 11 and the arrangement direction (hereinafter simply referred to as a "width direction"), the width of the cap layer 14 is smaller than the width of the semiconductor substrate 11, and the width of the light absorbing layer 12 is the same as the width of the semiconductor substrate 11. The semiconductor region 23 is formed along the lateral sides of the cap layer 14 facing each other in the width direction, and an area on which the cap layer 14 is not formed, the area is a part of the surface of the light absorbing layer 12 on the opposite side of the semiconductor substrate 11. The semiconductor region 23 is covered with the insulating film 18.

Figure 8:
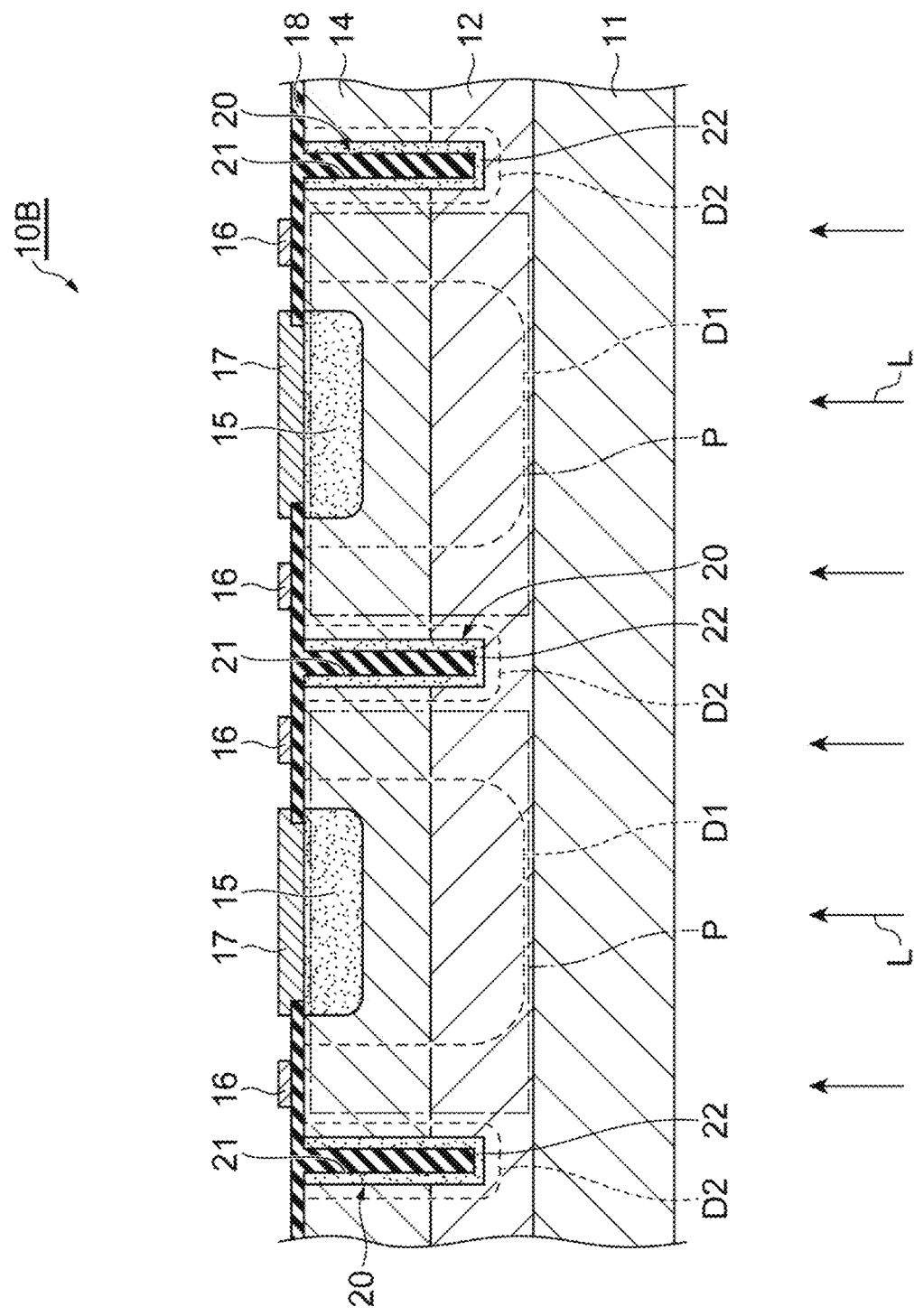
FIG. 8 is a cross-sectional view of a portion of the light detection element of the modification example.
Figure 9:
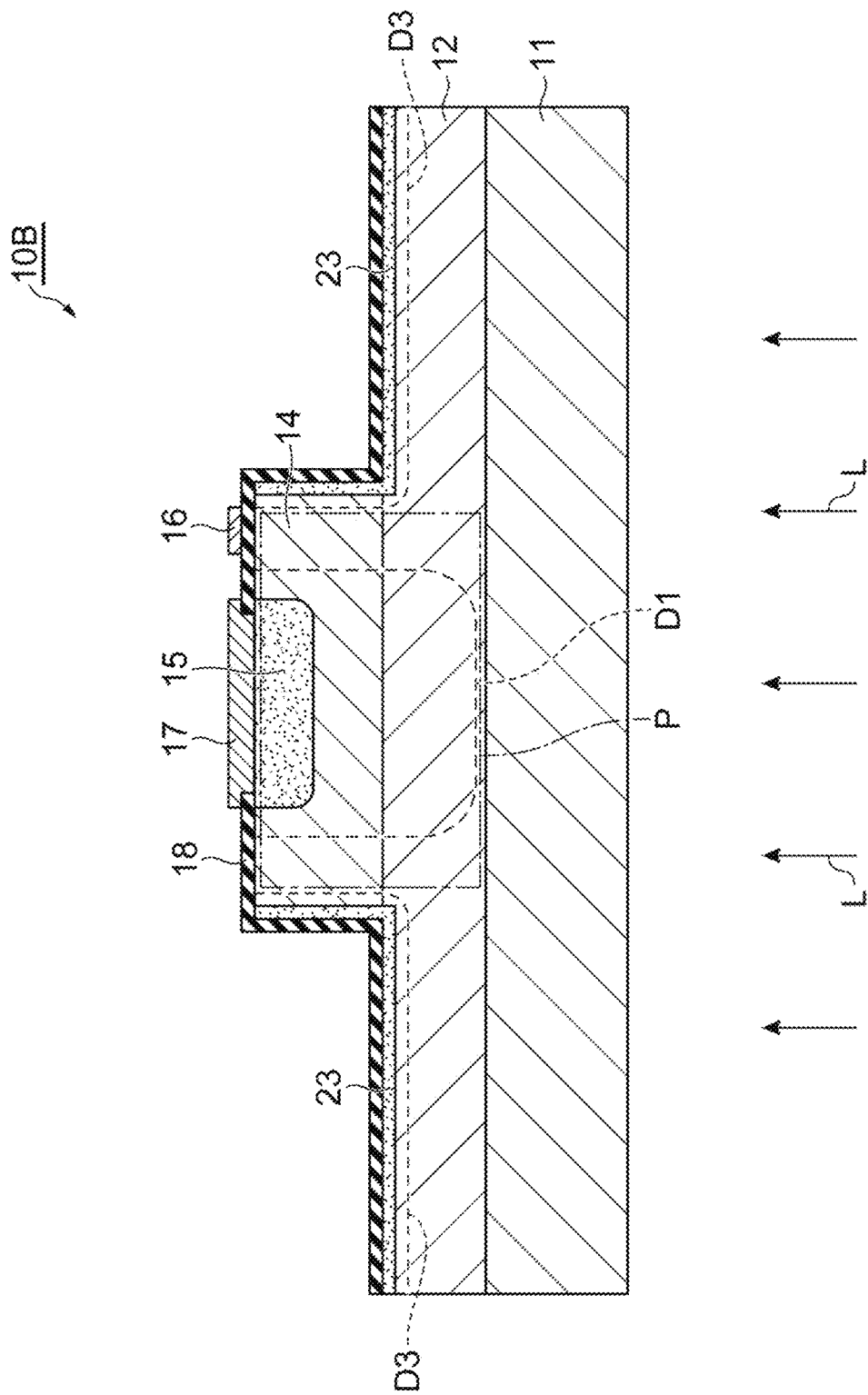
FIG. 9 is another cross-sectional view of the light detection element of the modification example.

In the light detection element 10B, as shown in FIGS. 8 and 9, only in a case where a reverse bias of 20 V is applied between the first electrode 16 and the second electrode 17, the depletion layer D1 exceeds a position amounting to 80% of the thickness of the light absorbing layer 12 from the cap layer 14 side. Thus, according to the light detection element 10B, similarly to the above-described the light detection element 10A, it is possible to realize control of output of a detection signal at a high speed with a simple configuration.

In addition, in the light detection element 10B, carriers generated in the light absorbing layer 12 in an unbiased state are trapped by not only the depletion layer D2 formed around the semiconductor region 22 of the pixel separation portion 20, but also a depletion layer D3 formed around the semiconductor region 23. Therefore, on the occasion of being switched from an unbiased state to a reverse bias application state, it is possible to prevent the carriers generated in the light absorbing layer 12 in an unbiased state from acting on noise.

In addition, in the light detection element 10B, the width of the cap layer 14 is smaller than the width of the semiconductor substrate 11 in the width direction. Thereby, it is possible to prevent carriers generated in a region around a pn junction region (a region of a pixel P) from acting on noise. Meanwhile, the width of the light absorbing layer 12 and the width of the cap layer 14 may be smaller than the width of the semiconductor substrate 11 in the width direction. In that case, it is possible to more reliably prevent carriers generated in a region around a pn junction region from acting on noise.

In addition, in the light detection element 10A shown in FIG. 3, the relaxation layer 13 of an n-type may not be formed between the light absorbing layer 12 and the cap layer 14. On the contrary, in the light detection element 10B shown in FIGS. 6 and 7, the relaxation layer 13 of an n-type may be formed between the light absorbing layer 12 and the cap layer 14. In a case where the relaxation layer 13 is not formed, and the light absorbing layer 12 and the cap layer 14 are in contact with each other, it is possible to possible to make a reverse bias for the depletion layer D1 to exceed a position amounting to at least 50% of the thickness of the light absorbing layer 12 from the cap layer 14 side. Meanwhile, in the light detection element 10B shown in FIGS. 6 and 7, in a case where the relaxation layer 13 is formed between the light absorbing layer 12 and the cap layer 14, the width of the relaxation layer 13 and the width of the cap layer 14 may be smaller than the width of the semiconductor substrate 11 in the width direction, or the width of the light absorbing layer 12, the width of the relaxation layer 13 and the width of the cap layer 14 may be smaller than the width of the semiconductor substrate 11 in the width direction. In those cases, it is possible to more reliably prevent carriers generated in a region around a pn junction region from acting on noise.

In addition, in the light detection element 10A shown in FIG. 3, the pixel separation portion 20 may not be provided. Similarly, in the light detection element 10B shown in FIGS. 6 and 7, the pixel separation portion 20 may not be provided. In addition, in the light detection element 10B shown in FIGS. 6 and 7, the semiconductor region 23 may not be formed.

In addition, in any of the above-described light detection elements 10A and 10B, in a case where a reverse bias of 20 V is applied between the first electrode 16 and the second electrode 17, the depletion layer D1 may exceed a position amounting to 50% of the thickness of the light absorbing layer 12 from the cap layer 14 side (a position amounting to 50% of the thickness of the light absorbing layer 12 from the surface of the light absorbing layer 12 on the cap layer 14 side with the surface used as a reference). To which position the depletion layer D1 is spread in a range of 50% to 100% of thickness of the light absorbing layer 12 from the cap layer 14 side by the application of a reverse bias of 20 V is determined in accordance with the wavelength of light to be detected, the incident direction of light to be detected, or the like.

In addition, both of the above-described light detection elements 10A and 10B may be configured as a surface incident type. In that case, the first electrode 16 is formed on, for example, the surface of the semiconductor substrate 11 on the opposite side of the light absorbing layer 12. In addition, for example, an opening for causing light to be detected to be incident on the light absorbing layer 12 is formed in the second electrode 17. In a case where each of the light detection elements 10A and 10B is configured as a surface incident type, it is preferable that the bandgap of a layer provided on the light incident side rather than the light absorbing layer 12 be larger than the bandgap of the light absorbing layer 12 from the viewpoint of the suppression of light absorption in the layer. Meanwhile, even in a case where each of the light detection elements 10A and 10B is configured as a rear surface incident type, it is preferable that the bandgap of a layer provided on the light incident side rather than the light absorbing layer 12 be larger than the bandgap of the light absorbing layer 12 from the viewpoint of the suppression of a dark current.

In addition, in any of the above-described light detection elements 10A and 10B, conductivity types of a p-type and an n-type may be reverse to those described above. In that case, since the first electrode 16 serves as a p-type side electrode, and the second electrode 17 serves as an n-type side electrode, a reverse bias is applied between the first electrode 16 and the second electrode 17 so that the potential of the second electrode 17 is set to a positive potential with the potential of the first electrode 16 used as a reference. Meanwhile, as described above, in a case where the semiconductor substrate 11, the light absorbing layer 12, the relaxation layer 13 and the cap layer 14 are an n-type, and the semiconductor region 15 is a p-type, it is possible to secure facilitation of manufacturing of the light detection elements 10A and 10B. In addition, in any of the above-described light detection elements 10A and 10B, a contact layer for decreasing contact resistance with an electrode may be formed on the cap layer 14.

Figure 10:
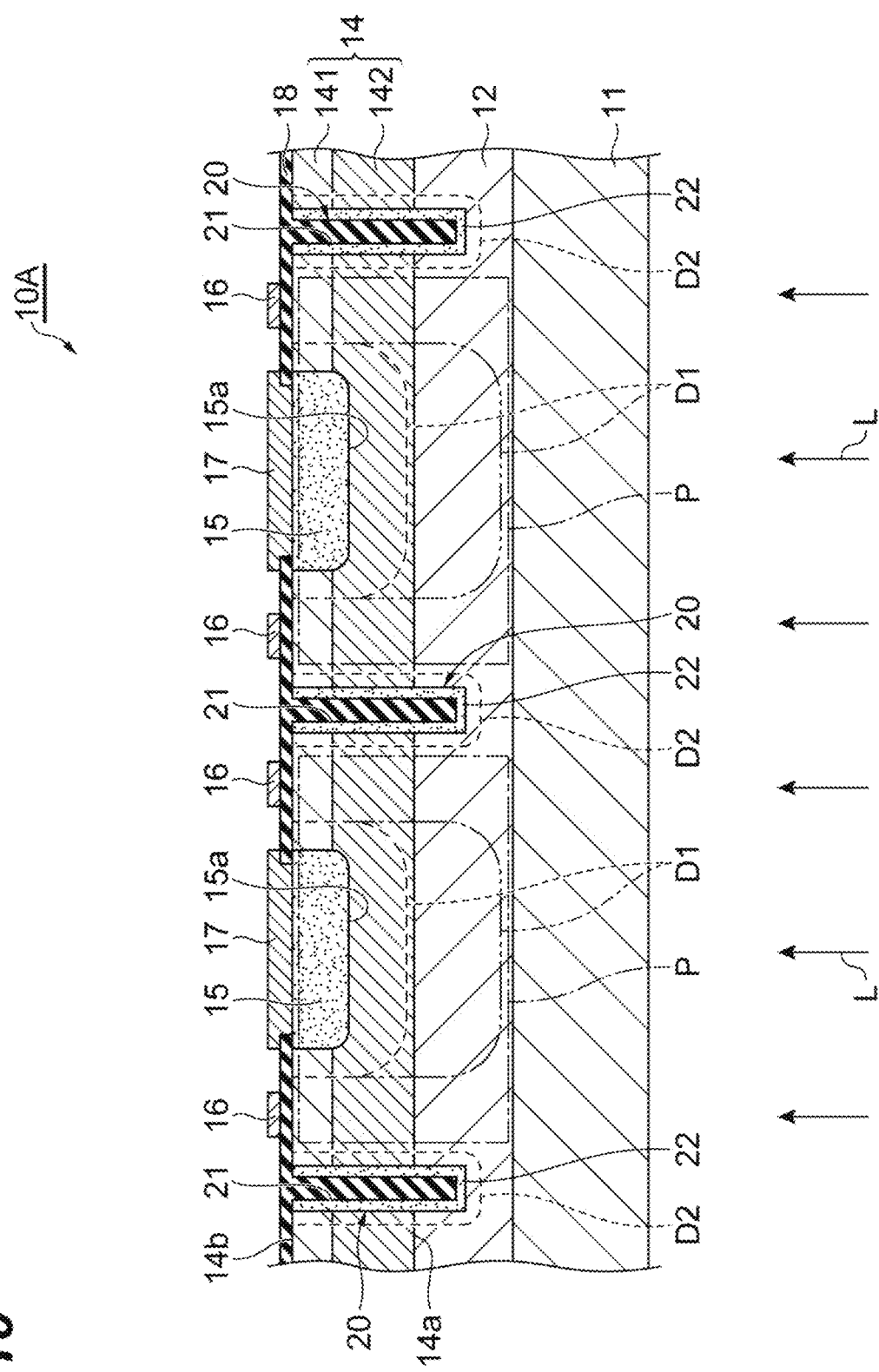
FIG. 10 is a cross-sectional view of a portion of the light detection element of the modification example.

In addition, as shown in FIG. 10, the cap layer 14 may include a first region 141 and a second region 142. The second region 142 is formed on the semiconductor substrate 11 side with respect to the first region 141 so as to be in contact with the first region 141 and to include a surface 14a of the cap layer 14 on the semiconductor substrate 11 side. The first region 141 is formed, for example, to include a surface 14b of the cap layer 14 located on the opposite side of the semiconductor substrate 11.

The first region 141 and the second region 142 are not sensitive to light to which the light absorbing layer 12 is sensitive (that is, by which photoelectric conversion can be generated in the light absorbing layer 12). The composition of the second region 142 is different from the composition of the first region 141. In a case where the semiconductor region 15 is formed within the first region 141, for example, by thermal diffusion, the composition of the first region 141 and the composition of the second region 142 are selected so that a diffusion speed in the second region 142 becomes slower than a diffusion speed in the first region 141. The material of the second region 142 may be, for example, a material which is lattice-matched with the material of the light absorbing layer 12, and the material of the first region 141 may be a material which is lattice-matched with the material of the second region 142.

As an example, the first region 141 is an n$^-$-InP layer having a carrier concentration of 0.3 to $5 \times 10^{15}$ cm$^{-3}$ (for example, approximately $1 \times 10^{15}$ cm$^{-3}$), and the thickness thereof is 0.5 to 1.5 μm (for example, approximately 1 μm). The second region 142 is an n-AlInAs layer (or, an AlIn-GaAs layer, an InGaAsP layer, an AlInAsP layer, and the like) having a carrier concentration of 0.3 to $5 \times 10^{15}$ cm$^{-3}$ (for example, approximately $1 \times 10^{15}$ cm$^{-3}$), and the thickness thereof is 0.5 to 1.5 μm (for example, approximately 1 μm).

The semiconductor region 15 is formed within the first region 141 so that an end 15a of the semiconductor region 15 on the semiconductor substrate 11 side reaches the second region 142. The end 15a of the semiconductor region 15 is located, for example, within an end of the second region 142 located on the opposite side of the semiconductor substrate 11.

As described above, in the configuration shown in FIG. 10, in a case where the semiconductor region 15 is formed within the first region 141, for example, by thermal diffusion, the composition of the first region 141 and the composition of the second region 142 are selected so that a diffusion speed in the second region 142 becomes slower than a diffusion speed in the first region 141. Thereby, it is possible to cause the semiconductor region 15 to fall within the cap layer 14 reliably, and to make the thickness (diffusion depth) of the semiconductor region 15 constant. In a case where the thickness of the semiconductor region 15 is made constant, it is possible to make a reverse bias to be applied constant.

In addition, in the configuration shown in FIG. 10, the first region 141 and the second region 142 are not sensitive to light to which the light absorbing layer 12 is sensitive. Thereby, it is possible to set the thickness of the second region 142 in accordance with a necessary thickness of the semiconductor region 15 without considering a light loss such as the light being absorbed in the second region 142.

Meanwhile, the configuration shown in FIG. 10 can be applied to both the light detection elements 10A and 10B described above. In addition, in the configuration shown in FIG. 10, conductivity types of a p-type and an n-type may be reverse to those described above. In addition, in the configuration shown in FIG. 10, the relaxation layer 13 may be formed between the light absorbing layer 12 and the cap layer 14, or may not be formed therebetween.

Figure 11:
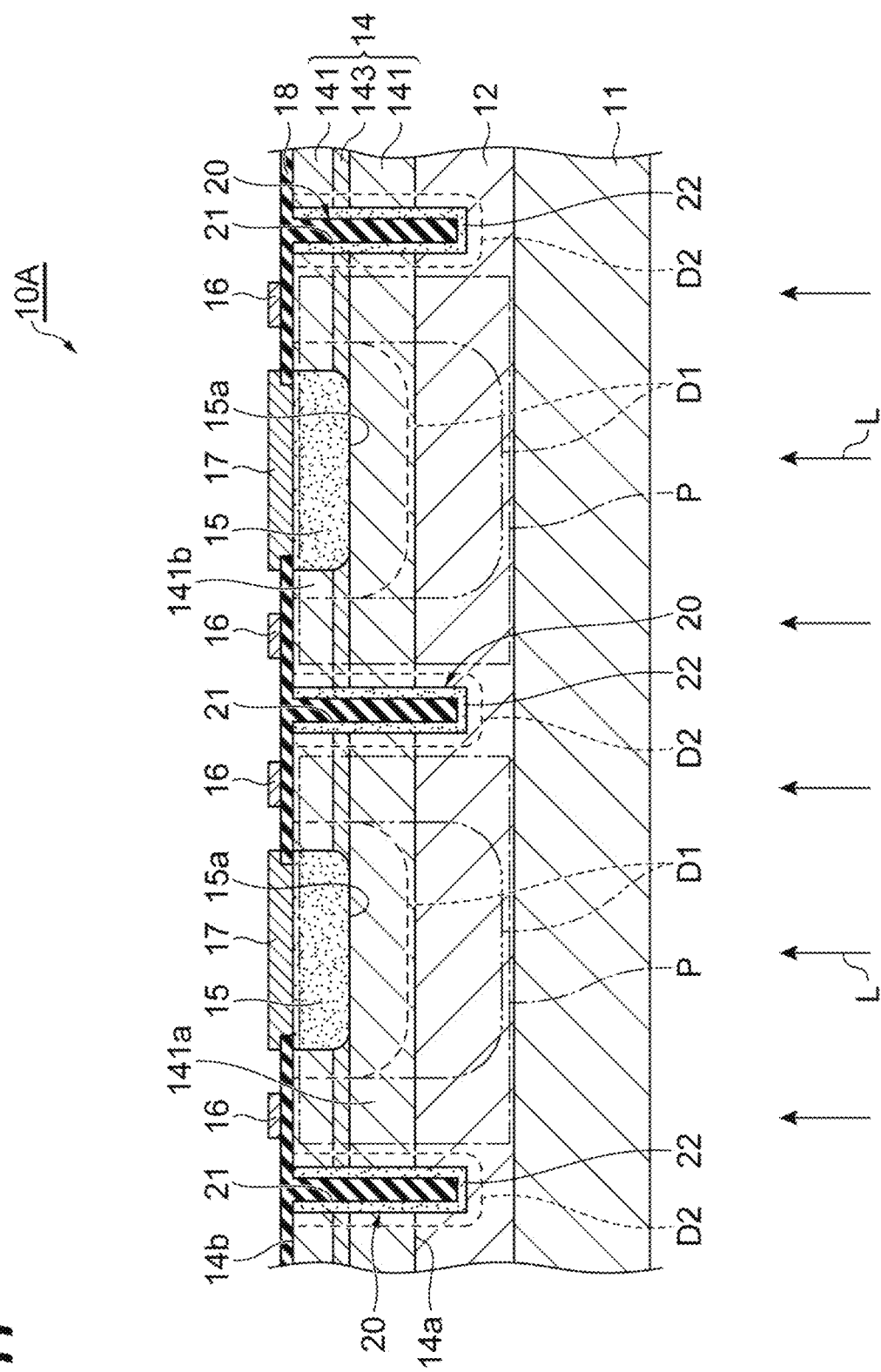
FIG. 11 is a cross-sectional view of a portion of the light detection element of the modification example.

In addition, as shown in FIG. 11, the cap layer 14 may include the first region 141 and a second region 143. The second region 143 is formed within the first region 141. That is, the second region 143 is formed between a region 141a of the first region 141 on the semiconductor substrate 11 side and a region 141b of the first region 141 located on the opposite side of the semiconductor substrate 11. The region 141a of the first region 141 is formed, for example, to include the surface 14a of the cap layer 14, and the region 141b of the first region 141 is formed, for example, to include the surface 14b of the cap layer 14.

The first region 141 and the second region 143 are not sensitive to light to which the light absorbing layer 12 is sensitive. The composition of the second region 143 is different from the composition of the first region 141. In a case where the semiconductor region 15 is formed within the first region 141, for example, by thermal diffusion, the composition of the first region 141 and the composition of the second region 143 are selected so that a diffusion speed in the second region 143 becomes slower than a diffusion speed in the first region 141. The material of the first region 141 may be a material which is lattice-matched with the materials of the light absorbing layer 12 and the second region 143, and the material of the second region 143 may be, for example, a material which is lattice-matched with the material of the first region 141.

As an example, the first region 141 is an n$^-$-InP layer having a carrier concentration of 0.3 to $5 \times 10^{15}$ cm$^{-3}$ (for example, approximately $1 \times 10^{15}$ cm$^{-3}$), and the thickness thereof is 0.5 to 1.5 μm (for example, approximately 1 μm). The second region 143 is an n-AlInAs layer (or, an AlIn-GaAs layer, an InGaAsP layer, an AlInAsP layer, and the like) having a carrier concentration of 0.3 to 5 cm$^{-3}$ (for example, approximately 1 cm$^{-3}$), and the thickness thereof is 0.05 to 0.45 μm (for example, approximately 0.2 μm).

The semiconductor region 15 is formed within the region 141b of the first region 141 located on the opposite side of the semiconductor substrate 11 with respect to the second region 143 so that the end 15a of the semiconductor region 15 reaches the second region 143. The end 15a of the semiconductor region 15 is located within, for example, the second region 143.

As described above, in the configuration shown in FIG. 11, in a case where the semiconductor region 15 is formed within the region 141b of the first region 141, for example, by thermal diffusion, the composition of the region 141b and the composition of the second region 143 are selected so that a diffusion speed in the second region 143 becomes slower than a diffusion speed in the region 141b. Thereby, it is possible to cause the semiconductor region 15 to fall within the cap layer 14 reliably, and to make the thickness (diffusion depth) of the semiconductor region 15 constant. In a case where the thickness of the semiconductor region 15 is made constant, it is possible to make a reverse bias to be applied constant.

In addition, in the configuration shown in FIG. 11, the first region 141 and the second region 143 are not sensitive to light to which the light absorbing layer 12 is sensitive. Thereby, it is possible to set the thickness of the second region 143 without considering a light loss such as the light being absorbed in the second region 143. However, in a case where the thickness of the second region 143 is small (it is preferable that the second region 143 be thinner than the first region 141), or a case where the end 15a of the semiconductor region 15 reaches an end of the second region 143 on the semiconductor substrate 11 side, the second region 143 may not have sensitivity to light to which the light absorbing layer 12 is sensitive. Meanwhile, even in a case where the second region 143 is not sensitive to light to which the light absorbing layer 12 is sensitive, when the bandgap of the second region 143 is narrower than the bandgap of the first region 141, an increase in a dark current is estimated, and when four or more kinds of elements are used for the material of the second region 143, an influence on crystallinity is estimated due to difficulty in controlling its composition. Therefore, even in a case where the second region 143 is not sensitive to light to which the light absorbing layer 12 is sensitive, the thickness of the second region 143 may be a thickness enough for the end 15a of the semiconductor region 15 formed by thermal diffusion to stop within the second region 143. In the configuration shown in FIG. 11, at least the first region 141 has only not to have sensitivity to light to which the light absorbing layer 12 is sensitive.

Meanwhile, the configuration shown in FIG. 11 can be applied to both the light detection elements 10A and 10B described above. In addition, in the configuration shown in FIG. 11, conductivity types of a p-type and an n-type may be reverse to those described above. In addition, in the configuration shown in FIG. 11, the relaxation layer 13 may be formed between the light absorbing layer 12 and the cap layer 14, or may not be formed therebetween.

Figure 12:
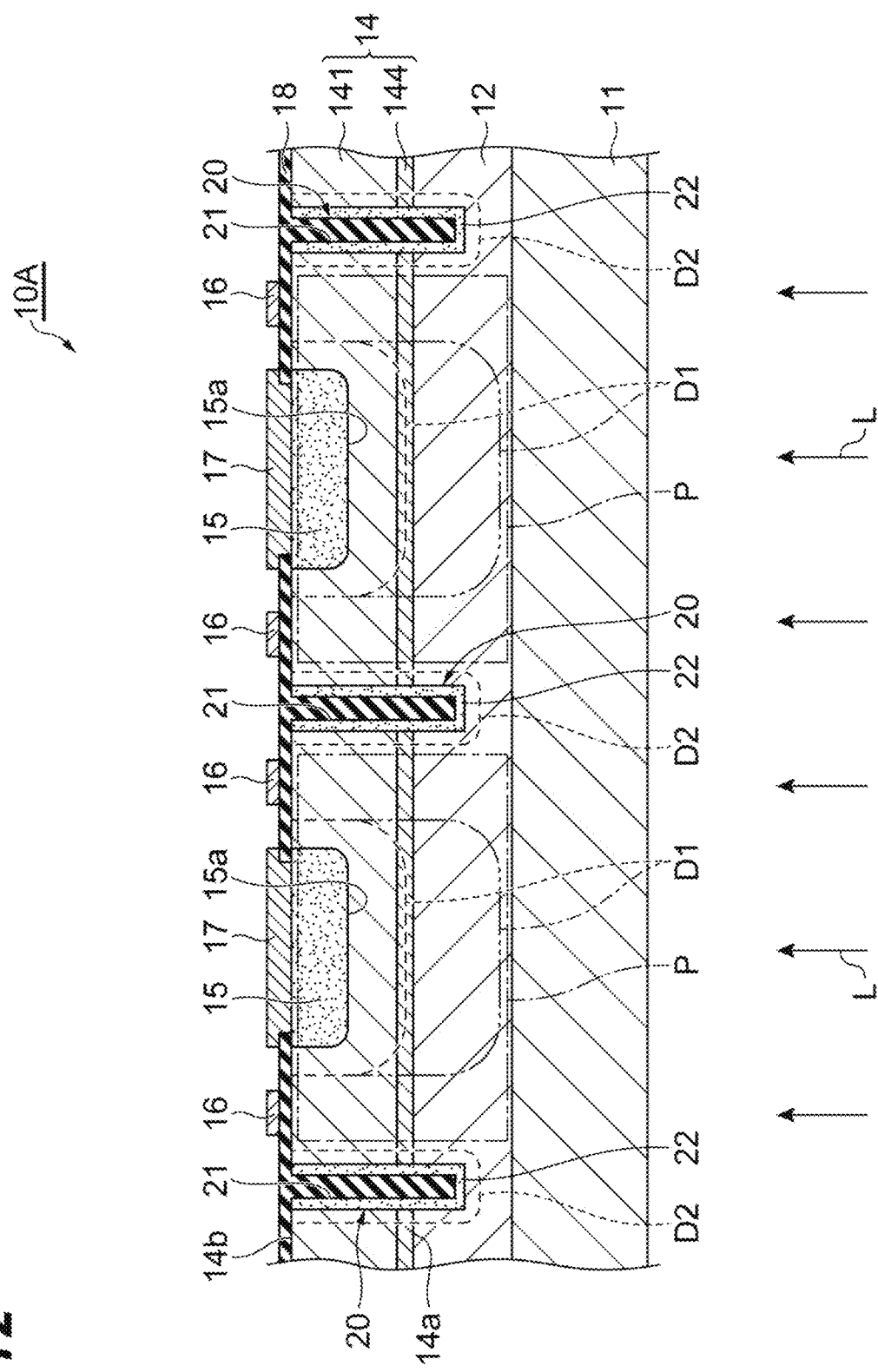
FIG. 12 is a cross-sectional view of a portion of the light detection element of the modification example.

In addition, as shown in FIG. 12, the cap layer 14 may include the first region 141 and a second region 144. The second region 144 is formed on the semiconductor substrate 11 side with respect to the first region 141 so as to be in contact with the first region 141. The first region 141 is formed, for example, to include the surface 14b of the cap layer 14, and the second region 144 is formed, for example, to include the surface 14a of the cap layer 14.

The first region 141 and the second region 144 are not sensitive to light to which the light absorbing layer 12 is sensitive. The carrier concentration of the second region 144 is higher than the carrier concentration of the first region 141. The composition of the second region 144 is the same as, for example, the composition of the first region 141.

As an example, the first region 141 is an n⁻-InP layer having a carrier concentration of 0.3 to $5 \times 10^{15}$ cm$^{-3}$ (for example, approximately $1 \times 10^{15}$ cm$^{-3}$), and the thickness thereof is 0.5 to 1.5 μm (for example, approximately 1 μm).

The second region 144 is an n-InP layer having a carrier concentration of 0.3 to $5 \times 10^{16}$ cm$^{-3}$ (for example, approximately $1 \times 10^{16}$ cm$^{-3}$), and the thickness thereof is 0.05 to 0.45 μm (for example, approximately 0.25 μm).

The semiconductor region 15 is formed within the first region 141 so that the end 15a of the semiconductor region 15 does not reach the second region 144. Thereby, in an unbiased state, the second region 144 serves as a barrier with respect to the spread of the depletion layer D1 (the depletion layer D1 shown by a broken line in FIG. 12), and the depletion layer D1 (the depletion layer D1 shown by a broken line in FIG. 12) falls within the cap layer 14. In a case where a reverse bias is applied, the depletion layer D1 (the depletion layer D1 shown by a dashed-two dotted line in FIG. 12) exceeds the second region 144 and reaches the light absorbing layer 12.

As described above, in the configuration shown in FIG. 12, the carrier concentration of the second region 144 is higher than the carrier concentration of the first region 141 so that the second region 144 serves as a barrier with respect to the spread of the depletion layer D1 in an unbiased state. Thereby, it is possible to prevent the depletion layer 131 from reaching the light absorbing layer 12 due to a variation during manufacturing or the like in spite of being in an unbiased state. Meanwhile, in order to cause the depletion layer D1 to reach the light absorbing layer 12 by the application of a lower reverse bias, it is preferable that the second region 144 be formed to include the surface 14a of the cap layer 14, and it is preferable that the thickness of the second region 144 is small (it is preferable that the second region 144 is thinner than the first region 141).

In addition, in the configuration shown in FIG. 12, the first region 141 and the second region 144 are not sensitive to light to which the light absorbing layer 12 is sensitive. Thereby, it is possible to set the thickness of the second region 144 without considering a light loss such as the light being absorbed in the second region 144.

Meanwhile, the configuration shown in FIG. 12 can be applied to both the light detection elements 10A and 10B described above. In addition, in the configuration shown in FIG. 12, conductivity types of a p-type and an n-type may be reverse to those described above. In addition, in the configuration shown in FIG. 12, the relaxation layer 13 may be formed between the light absorbing layer 12 and the cap layer 14, or may not be formed therebetween.

From the above, the light detection element of the present disclosure includes a semiconductor substrate, a light absorbing layer of a first conductivity type formed on the semiconductor substrate, a cap layer of a first conductivity type formed on the light absorbing layer, and a first semiconductor region of a second conductivity type, formed within the cap layer and forming a pn junction with the cap layer. The light detection element may be configured such that the cap layer includes a first region and a second region formed on the semiconductor substrate side with respect to the first region so as to be in contact with the first region and to include a surface of the cap layer on the semiconductor substrate side, the first region and the second region are not sensitive to light to which the light absorbing layer is sensitive, a composition of the second region is different from a composition of the first region, and the first semiconductor region is formed within the first region so that an end of the first semiconductor region on the semiconductor substrate side reaches the second region.

In addition, the light detection element of the present disclosure includes a semiconductor substrate, a light absorbing layer of a first conductivity type formed on the semiconductor substrate, a cap layer of a first conductivity type formed on the light absorbing layer, and a first semiconductor region of a second conductivity type, formed within the cap layer and forming a pn junction with the cap layer. The light detection element may be configured such that the cap layer includes a first region and a second region formed within the first region, the first region is not sensitive to light to which the light absorbing layer is sensitive, a composition of the second region is different from a composition of the first region, and the first semiconductor region is formed within a region of the first region located on the opposite side of the semiconductor substrate with respect to the second region so that an end of the first semiconductor region on the semiconductor substrate side reaches the second region.

In addition, the light detection element of the present disclosure includes a semiconductor substrate, a light absorbing layer of a first conductivity type formed on the semiconductor substrate, a cap layer of a first conductivity type formed on the light absorbing layer, and a first semiconductor region of a second conductivity type, formed within the cap layer and forming a pn junction with the cap layer. The light detection element may be configured such that the cap layer includes a first region and a second region formed on the semiconductor substrate side with respect to the first region so as to be in contact with the first region, a carrier concentration of the second region is higher than a carrier concentration of the first region, and the first semiconductor region is formed within the first region so that an end of the first semiconductor region on the semiconductor substrate side does not reach the second region.

In addition, both of the above-described light detection elements 10A and 10B may be configured as a single element in which one semiconductor region 15 is formed within the cap layer 14. In that case, it is also possible to realize control of output of a detection signal at a high speed with a simple configuration. In addition, in that case, it is configured as the light detection device 1, so that it is also possible to acquire information relating to the distance d to the object OJ.

In addition, various materials and shapes can be applied to the configurations of the above-described light detection elements 10A and 10B without being limited to the above-described materials and shapes. For example, the above-described materials of the light detection elements 10A and 10B may be organic semiconductors, amorphous materials, or the like without being limited to compound semiconductors. In addition, the configurations in the above-described embodiment or modification example can be arbitrarily applied to configurations other embodiments or modification examples.

In addition, the voltage signal which is applied to each of the light detection elements 10A and 10B by the signal processing circuit 6 in the light detection device 1 is not limited to the pulse voltage signal as described above, and may be a voltage signal including a first voltage at which the depletion layer D1 does not reach the light absorbing layer 12 and a second voltage at which the depletion layer D1 reaches the light absorbing layer 12.

In addition, the light detection device 1 may not include the light source 3. An example of the light detection device 1 in that case to be exemplified includes an infrared image sensor having a global shutter operation (high-speed shutter operation) required for detecting high-speed objects and signals, or the like.

According to an aspect of the present disclosure, there is provided a light detection element including: a semiconductor substrate; a light absorbing layer of a first conductivity type formed on the semiconductor substrate; a cap layer of a first conductivity type formed on the light absorbing layer; and a semiconductor region of a second conductivity type formed within the cap layer and forming a pn junction with the cap layer, wherein a depletion layer formed around the semiconductor region does not reach the light absorbing layer in a case where a reverse bias is not applied to the pn junction, and exceeds a position amounting to 50% of a thickness of the light absorbing layer from the cap layer side in a case where a reverse bias of 20 V is applied to the pn junction.

In this light detection element, in a case where a reverse bias is not applied to the pn junction, the depletion layer does not reach the light absorbing layer. Thereby, even when carriers (electrons and holes) are generated in the light absorbing layer due to the incidence of light to be detected, a current does not flow through the pn junction. That is, for example, a reverse bias is not applied to the pn junction, so that it is possible not to output a detection signal from the light detection element to the outside. On the other hand, in a case where a reverse bias of 20 V is applied to the pn junction, the depletion layer exceeds a position amounting to 50% of the thickness of light absorbing layer from the cap layer side. Thereby in a case where carriers are generated in a region of the light absorbing layer in which the depletion layer spreads due to the incidence of light to be detected, a current flows through the pn junction. That is, for example, a reverse bias of 20 V is applied to the pn junction, so that it is possible to output a detection signal from the light detection element to the outside. Here, the potential difference of 20 V is, for example, a potential difference which is not likely to influence the design of a latter-stage circuit such as a CMOS, and is a potential difference by which modulation at a high speed such as on the order of several tens of ns is possible. Thus, according to this light detection element, it is possible to realize control of output of a detection signal at a high speed with a simple configuration.

In the light detection element of an aspect of the present disclosure, the depletion layer may exceed a position amounting to 80% of the thickness of the light absorbing layer from the cap layer side in a case where a reverse bias of 20 V is applied to the pn junction. According to this, it is possible to achieve an improvement in sensitivity and responsiveness. Particularly, the light detection element is effective in a configuration in which light is caused to be incident from the semiconductor substrate side.

The light detection element of an aspect of the present disclosure may further include a relaxation layer of a first conductivity type formed between the light absorbing layer and the cap layer. According to this, it is possible to smoothly move carriers generated in a region of the light absorbing layer in which the depletion layer spreads.

In the light detection element of an aspect of the present disclosure, the light absorbing layer and the cap layer may be in contact with each other. According to this, it is possible to further reduce a reverse bias for the depletion layer to exceed a position amounting to at least 50% of the thickness of the light absorbing layer from the cap layer side.

In the light detection element of an aspect of the present disclosure, a plurality of semiconductor regions, each of which is the first semiconductor region, may be formed within the cap layer, and be arranged one-dimensionally or two-dimensionally when viewed from a thickness direction of the semiconductor substrate. According to this, the light detection element can be used for acquiring a distance image.

In the light detection element of an aspect of the present disclosure, a plurality of semiconductor regions, each of which is the first semiconductor region, may be formed within the cap layer, and be arranged one-dimensionally when viewed from a thickness direction of the semiconductor substrate, and a width of the cap layer may be smaller than a width of the semiconductor substrate in a width direction perpendicular to both the thickness direction of the semiconductor substrate and an arrangement direction of the semiconductor regions. According to this, it is possible to prevent carriers generated in a region around a pn junction region from acting on noise.

In the light detection element of an aspect of the present disclosure, a width of the light absorbing layer may be smaller than the width of the semiconductor substrate in the width direction. According to this, it is possible to more reliably prevent carriers generated in a region around a pn junction region from acting on noise.

In the light detection element of an aspect of the present disclosure, the first conductivity type may be an n-type, and the second conductivity type may be a p-type. According to this, it is possible to secure facilitation of manufacturing of the light detection element.

According to an aspect of the present disclosure, there is provided a light detection device including: the above-described light detection element; and a signal processing unit configured to apply a pulse voltage signal to the pn junction, and to acquire a detection signal output from the light detection element, wherein the pulse voltage signal is a voltage signal in which a first voltage at which the depletion layer does not reach the light absorbing layer and a second voltage at which the depletion layer reaches the light absorbing layer are alternately repeated.

According to this light detection device, it is possible to acquire information relating to a distance to an object, for example, by irradiating an object with pulsed light to which the light detection element is sensitive and causing pulsed light reflected from the object to be incident on the light detection element in a state in which a pulse voltage signal is applied to the light detection element.

In the light detection device of an aspect of the present disclosure, the second voltage may be a voltage at which the depletion layer reaches a position amounting to 100% of the thickness of the light absorbing layer from the cap layer side. According to this, it is possible to achieve an improvement in sensitivity and responsiveness. Particularly, the light detection device is effective in a configuration in which light is caused to be incident from the semiconductor substrate side.

In the light detection device of an aspect of the present disclosure, the second voltage may be a voltage of 20 V or lower. According to this, it is possible to more reliably achieve an improvement in sensitivity and responsiveness.

In the light detection device of an aspect of the present disclosure, the second voltage may be a voltage of 10 V or lower. According to this, it is possible to more reliably achieve an improvement in sensitivity and responsiveness.

In the light detection device of an aspect of the present disclosure, the second voltage may be a voltage of 5 V or lower. According to this, it is possible to more reliably achieve an improvement in sensitivity and responsiveness.

The light detection device of an aspect of the present disclosure may further include a light source configured to output pulsed light to which the light detection element is sensitive. According to this, it is possible to acquire information relating to a distance to an object as described above.

In the light detection device of an aspect of the present disclosure, the light source may be configured to output the pulsed light at a frequency of 10 KHz or higher. According to this, it is possible to appropriately acquire information relating to a distance to an object.

Reference Signs List

1: light detection device, 3: light source, 6: signal processing circuit (signal processing unit), 10A, 10B: light detection element, 11: semiconductor substrate, 12: light absorbing layer, 13: relaxation layer, 14: cap layer, 15: semiconductor region, 16: first electrode, 17: second electrode, D1: depletion layer

The invention claimed is:

1. A light detection device comprising:
a light detection element; and
a signal processing unit,
wherein the light detection element includes:
a semiconductor substrate;
a light absorbing layer of a first conductivity type formed on the semiconductor substrate;
a cap layer of a first conductivity type formed on the light absorbing layer; and
a first semiconductor region of a second conductivity type formed within the cap layer and forming a pn junction with the cap layer,
wherein a depletion layer formed around the first semiconductor region does not reach the light absorbing layer in a case where a reverse bias is not applied to the pn junction, and exceeds a position amounting to 50% of a thickness of the light absorbing layer from the cap layer side in a case where a reverse bias of 20 V is applied to the pn junction,
the carrier concentration of the cap layer is equal to or less than $1 \times 10^{16}$ cm$^3$, and
the signal processing unit is configured to apply a voltage signal to the pn junction such that a state in which the depletion layer does not reach the light absorbing layer and a state in which the depletion layer reaches the light absorbing layer are alternately repeated.

2. The light detection device according to claim 1, wherein the signal processing unit configured to acquire a detection signal output from the light detection element.

3. The light detection device according to claim 1, wherein the depletion layer exceeds a position amounting to 80% of the thickness of the light absorbing layer from the cap layer side in a case where a reverse bias of 20 V is applied to the pn junction.

4. The light detection device according to claim 1, wherein the light detection element further includes a relaxation layer of a first conductivity type formed between the light absorbing layer and the cap layer.

5. The light detection device according to claim 1, wherein the light absorbing layer and the cap layer are in contact with each other.

6. The light detection device according to claim 1, wherein a plurality of first semiconductor regions, each of which is the first semiconductor region, are formed within the cap layer, and are arranged one-dimensionally or two-dimensionally when viewed from a thickness direction of the semiconductor substrate.

7. The light detection device according to claim 1, wherein a plurality of first semiconductor regions, each of which is the first semiconductor region, are formed within the cap layer, and are arranged one-dimensionally when viewed from a thickness direction of the semiconductor substrate, and a width of the cap layer is smaller than a width of the semiconductor substrate in a width direction perpendicular to both the thickness direction of the semiconductor substrate and an arrangement direction of the first semiconductor regions.

8. The light detection device according to claim 7, wherein a width of the light absorbing layer is smaller than the width of the semiconductor substrate in the width direction.

9. The light detection device according to claim 7, wherein the light detection element further includes a third semiconductor region of a second conductivity type formed along lateral sides of the cap layer facing each other in the width direction.

10. The light detection device according to claim 7, wherein the light detection element further includes a third semiconductor region of a second conductivity type formed along an area on which the cap layer is not formed, the area is a part of a surface of the light absorbing layer on the opposite side of the semiconductor substrate.

11. The light detection device according to claim 1, wherein the first conductivity type is an n-type, and the second conductivity type is a p-type.

12. The light detection device according to claim 1, wherein the light detection element further includes a second semiconductor region of a second conductivity type formed in the cap layer so as to surround the first semiconductor region when viewed from a thickness direction of the semiconductor substrate.

13. The light detection device according to claim 12, wherein the second semiconductor region is formed along an inner surface of a groove formed in the cap layer so as to surround the first semiconductor region when viewed from the thickness direction of the semiconductor substrate.

14. The light detection device according to claim 13, wherein the inner surface of the groove is covered with an insulating film.

15. The light detection device according to claim 13, wherein the groove reaches a relaxation layer of a first conductivity type formed between the light absorbing layer and the cap layer.

16. The light detection device according to claim 13, wherein the groove reaches the light absorbing layer.

17. The light detection device according to claim 1, wherein the light detection element further includes a second semiconductor region of a second conductivity type, wherein a plurality of first semiconductor regions, each of which is the first semiconductor region, are formed within the cap layer, and the second semiconductor region is formed in the cap layer so as to be located between the first semiconductor regions which are next to each other when viewed from a thickness direction of the semiconductor substrate.

18. The light detection device according to claim 13, wherein the second semiconductor region is formed along an inner surface of a groove formed in the cap layer so as to be located between the first semiconductor regions which are next to each other when viewed from the thickness direction of the semiconductor substrate.

19. The light detection device according to claim 18, wherein the inner surface of the groove is covered with an insulating film.

20. The light detection device according to claim 18, wherein the groove reaches a relaxation layer of a first conductivity type formed between the light absorbing layer and the cap layer.

21. The light detection device according to claim 18, wherein the groove reaches the light absorbing layer.

22. The light detection device according to claim 1, wherein the cap layer includes:

a first region; and a second region formed on the semiconductor substrate side with respect to the first region so as to be in contact with the first region and to include a surface of the cap layer on the semiconductor substrate side, the first region and the second region are not sensitive to light to which the light absorbing layer is sensitive, a composition of the second region is different from a composition of the first region, and the first semiconductor region is formed within the first region so that an end of the first semiconductor region on the semiconductor substrate side reaches the second region.

23. The light detection device according to claim 1, wherein the cap layer includes:

a first region; and a second region formed within the first region, wherein the first region is not sensitive to light to which the light absorbing layer is sensitive, a composition of the second region is different from a composition of the first region, and the first semiconductor region is formed within a region of the first region located on the opposite side of the semiconductor substrate with respect to the second region so that an end of the first semiconductor region on the semiconductor substrate side reaches the second region.

24. The light detection device according to claim 1, wherein the cap layer includes:

a first region; and a second region formed on the semiconductor substrate side with respect to the first region so as to be in contact with the first region, wherein a carrier concentration of the second region is higher than a carrier concentration of the first region, and the first semiconductor region is formed within the first region so that an end of the first semiconductor region on the semiconductor substrate side does not reach the second region.

25. The light detection device according to claim 1, wherein the voltage signal is a voltage signal including a first voltage at which the depletion layer does not reach the light absorbing layer and a second voltage at which the depletion layer reaches the light absorbing layer.

26. The light detection device according to claim 25, wherein the voltage signal is a pulse voltage signal in which the first voltage and the second voltage are alternately repeated.

27. The light detection device according to claim 25, wherein the second voltage is a voltage at which the depletion layer reaches a position amounting to 100% of the thickness of the light absorbing layer from the cap layer side.

28. The light detection device according to claim 25, wherein the second voltage is a voltage of 20 V or lower.

29. The light detection device according to claim 25, wherein the second voltage is a voltage of 10 V or lower.

30. The light detection device according to claim 25, wherein the second voltage is a voltage of 5 V or lower.

31. The light detection device according to claim 25, further comprising a light source configured to output pulsed light to which the light detection element is sensitive.

32. The light detection device according to claim 31, wherein the light source is configured to output the pulsed light at a frequency of 10 KHz or higher.

33. A light detection element comprising:
a semiconductor substrate;
a light absorbing layer of a first conductivity type formed on the semiconductor substrate;
a cap layer of a first conductivity type formed on the light absorbing layer; and
a first semiconductor region of a second conductivity type formed within the cap layer and forming a pn junction with the cap layer,
wherein a depletion layer formed around the first semiconductor region does
not reach the light absorbing layer in a case where a reverse bias is not applied to the pn junction, and exceeds a position amounting to 50% of a thickness of the light absorbing layer from the cap layer side in a case where a reverse bias of 20 V is applied to the pn junction,
a plurality of first semiconductor regions, each of which is the first semiconductor region, are formed within the cap layer, and are arranged one-dimensionally when viewed from a thickness direction of the semiconductor substrate, and
a width of the cap layer is smaller than a width of the semiconductor substrate in a width direction perpendicular to both the thickness direction of the semiconductor substrate and an arrangement direction of the first semiconductor regions.

34. The light detection element according to claim 33, wherein a width of the light absorbing layer is smaller than the width of the semiconductor substrate in the width direction.

35. The light detection element according to claim 33, further comprising a third semiconductor region of a second conductivity type formed along lateral sides of the cap layer facing each other in the width direction.

36. The light detection element according to claim 33, further comprising a third semiconductor region of a second conductivity type formed along an area on which the cap layer is not formed, the area is a part of a surface of the light absorbing layer on the opposite side of the semiconductor substrate.

37. A light detection element comprising:
a semiconductor substrate;
a light absorbing layer of a first conductivity type formed on the semiconductor substrate;
a cap layer of a first conductivity type formed on the light absorbing layer; and
a first semiconductor region of a second conductivity type formed within the cap layer and forming a pn junction with the cap layer,
wherein a depletion layer formed around the first semiconductor region does not reach the light absorbing layer in a case where a reverse bias is not applied to the pn junction, and exceeds a position amounting to 50% of a thickness of the light absorbing layer from the cap layer side in a case where a reverse bias of 20 V is applied to the pn junction,
the cap layer includes:
a first region; and
a second region formed on the semiconductor substrate side with respect to the first region so as to be in contact with the first region and to include a surface of the cap layer on the semiconductor substrate side,
the first region and the second region are not sensitive to light to which the light absorbing layer is sensitive,
a composition of the second region is different from a composition of the first region, and
the first semiconductor region is formed within the first region so that an end of the first semiconductor region on the semiconductor substrate side reaches the second region.

38. A light detection element comprising:
a semiconductor substrate;
a light absorbing layer of a first conductivity type formed on the semiconductor substrate;
a cap layer of a first conductivity type formed on the light absorbing layer; and
a first semiconductor region of a second conductivity type formed within the cap layer and forming a pn junction with the cap layer,
wherein a depletion layer formed around the first semiconductor region does not reach the light absorbing layer in a case where a reverse bias is not applied to the pn junction, and exceeds a position amounting to 50% of a thickness of the light absorbing layer from the cap layer side in a case where a reverse bias of 20 V is applied to the pn junction,
the cap layer includes:
a first region; and
a second region formed within the first region,
wherein the first region is not sensitive to light to which the light absorbing layer is sensitive,
a composition of the second region is different from a composition of the first region, and
the first semiconductor region is formed within a region of the first region located on the opposite side of the semiconductor substrate with respect to the second region so that an end of the first semiconductor region on the semiconductor substrate side reaches the second region.

39. A light detection element comprising:
a semiconductor substrate;
a light absorbing layer of a first conductivity type formed on the semiconductor substrate;
a cap layer of a first conductivity type formed on the light absorbing layer; and
a first semiconductor region of a second conductivity type formed within the cap layer and forming a pn junction with the cap layer,
wherein a depletion layer formed around the first semiconductor region does not reach the light absorbing layer in a case where a reverse bias is not applied to the pn junction, and exceeds a position amounting to 50% of a thickness of the light absorbing layer from the cap layer side in a case where a reverse bias of 20 V is applied to the pn junction,
the cap layer includes:
a first region; and
a second region formed on the semiconductor substrate side with respect to the first region so as to be in contact with the first region,
wherein a carrier concentration of the second region is higher than a carrier concentration of the first region, and
the first semiconductor region is formed within the first region so that an end of the first semiconductor region on the semiconductor substrate side does not reach the second region.

* * * * *